US005834791A

United States Patent [19]

Nakanishi et al.

[11] Patent Number: 5,834,791

[45] **Date of Patent: *Nov. 10, 1998**

[54] PROCESS OF EMITTING HIGHLY SPIN-POLARIZED ELECTRON BEAM AND SEMICONDUCTOR DEVICE THEREFOR

[75] Inventors: Tsutomu Nakanishi, Nagoya; Hiromichi Horinaka, Suita; Takashi Saka, Nagoya; Toshihiro Kato, Kasugai, all of Japan

[73] Assignee: Daido Tokushuko Kabushiki Kaisha, Nagoya, Japan

[ * ] Notice: The term of this patent shall not extend beyond the expiration date of Pat. No. 5,315,127.

[21] Appl. No.: 960,592

[22] Filed: Oct. 30, 1997

Related U.S. Application Data

[60] Continuation of Ser. No. 557,826, Nov. 14, 1995, abandoned, which is a division of Ser. No. 214,319, Mar. 17, 1994, Pat. No. 5,723,871, which is a continuation-in-part of Ser. No. 876,579, Apr. 30, 1992, Pat. No. 5,315,127.

[30] Foreign Application Priority Data

| | | | |
|---|---|---|---|
| May 2, 1991 | [JP] | Japan | 3-130611 |
| Jun. 7, 1991 | [JP] | Japan | 3-163642 |
| Mar. 21, 1992 | [JP] | Japan | 4-94807 |
| Mar. 18, 1993 | [JP] | Japan | 5-84033 |
| Oct. 18, 1993 | [JP] | Japan | 5-260072 |

[51] Int. Cl.[6] .......... H01L 29/20

[52] U.S. Cl. .......... 257/11; 250/423 P; 313/542

[58] Field of Search .......... 257/10–11; 250/423 P, 250/423 R, 493.1; 313/542

[56] References Cited

U.S. PATENT DOCUMENTS

| | | | |
|---|---|---|---|
| 3,968,376 | 7/1976 | Pierce et al. | 250/493.1 |
| 4,928,154 | 5/1990 | Umeno et al. | 257/190 |
| 5,117,469 | 5/1992 | Cheung et al. | 385/11 |
| 5,132,746 | 7/1992 | Mendez et al. | 257/190 |

OTHER PUBLICATIONS

T. Maruyama, et al., "Observation of Strain–Enhanced Electron–Spin Polarization in Photoemission from InGaAs," Physical Review Letters, vol. 66, No. 18, pp. 2376–2379.

W. Hartmann, et al., "A Source of Polarized Electrons Based on Photoemission of GaAsP," Nuclear Instruments and Methods in Physical Research A286, No. 1/2, Jan. 1990, pp. 1–8.

Sze, "Physics of Semiconductor Devices," 1981, p. 706.

*Primary Examiner*—John Guay

*Attorney, Agent, or Firm*—Oblon, Spivak, McClelland, Maier & Neustadt, P.C.

[57] ABSTRACT

A process of producing a highly spin-polarized electron beam, including the steps of applying a light energy to a semiconductor device comprising a first compound semiconductor layer having a first lattice constant and a second compound semiconductor layer having a second lattice constant different from the first lattice constant, the second semiconductor layer being in junction contact with the first semiconductor layer to provide a strained semiconductor heterostructure, a magnitude of mismatch between the first and second lattice constants defining an energy splitting between a heavy hole band and a light hole band in the second semiconductor layer, such that the energy splitting is greater than a thermal noise energy in the second semiconductor layer in use; and extracting the highly spin-polarized electron beam from the second semiconductor layer upon receiving the light energy. A semiconductor device for emitting, upon receiving a light energy, a highly spin-polarized electron beam, including a first compound semiconductor layer formed of gallium arsenide phosphide, $GaAs_{1-x}P_x$, and having a first lattice constant; and a second compound semiconductor layer provided on the first semiconductor layer, the second semiconductor layer having a second lattice constant different from the first lattice constant and a thickness, t, smaller than the thickness of the first semiconductor layer.

22 Claims, 17 Drawing Sheets

214 : $GaAs_{1-x}P_x$ LAYER

216 : $GaAs_{1-y}P_y$ LAYER

PROCESS OF EMITTING HIGHLY SPIN-POLARIZED ELECTRON BEAM AND SEMICONDUCTOR DEVICE THEREFOR

This application is a Continuation of application Ser. No. 08/557,826, filed on Nov. 14, 1995, now abandoned, which is a Division of application Ser. No. 08/214,319, filed on Mar. 17, 1994, now U.S. Pat. No. 5,723,871, which is a Continuation-In-Part of application Ser. No. 07/876,579, filed on Apr. 30, 1992, now U.S. Pat. No. 5,315,127.

BACKGROUND OF THE INVENTION

1. Field of the Invention

The present invention relates to a process of emitting, upon receiving a light energy, a highly spin-polarized electron beam and a semiconductor device therefor.

2. Related Art Statement

Spin-polarized electron beam in which a large or major portion of the electrons have their spins aligned in one of the two spin directions, is used in the field of high-energy elementary-particle experiment for investigating the magnetic structure of atomic nucleus, or in the field of material physics experiment for studying the magnetic structure of material's surface. For generating a spin-polarized electron beam, it is commonly practiced to apply a circularly polarized laser beam to the surface of a compound semiconductor crystal such as of gallium arsenide GaAs, so that the semiconductor crystal emits an electron beam in which the spin directions of the electrons are largely aligned in one of the two directions because of the selective transition due to the law of conservation of angular momentum.

However, it is theoretically estimated that the above-indicated conventional, spin-polarized electron beam emitting device would suffer from an upper limit, 50%, to polarization (degree of polarity) of the spin-polarized electron beam emitted therefrom, at which limit the ratio of the number of electrons having upspins to the number of electrons having downspins is 1 to 3, or 3 to 1. In addition, it is technically difficult to achieve the theoretical upper limit of 50% because of various sorts of restrictions, and accordingly only a polarization of about 40% at most is available. Thus, the conventional semiconductor device is not capable of producing a highly spin-polarized electron beam having a not less than 50% polarization.

Meanwhile, it is possible to provide a spin-polarized electron beam emitting device in which a semiconductor crystal has a stress in a certain direction so as to have a uniaxial anisotropy in the valence band thereof. However, it is difficult to cause the semiconductor crystal to have a sufficiently large strain or cause the crystal to have a strain in a stable manner. In addition, this device would suffer from the problem that an external means used for producing the stress or strain in the semiconductor crystal may interfere with extraction of the spin-polarized electron beam therefrom.

SUMMARY OF THE INVENTION

It is therefore an object of the present invention to provide a process of emitting a highly spin-polarized electron beam from a semiconductor device.

It is another object of the invention to provide a semiconductor device for emitting a highly spin-polarized electron beam in a simple and stable manner.

The above objects have been achieved by the present invention. According to a first aspect of the present invention, there is provided a process of producing a highly spin-polarized electron beam, comprising the steps of: (a) applying a light energy to a semiconductor device comprising a first compound semiconductor layer having a first lattice constant and a second compound semiconductor layer having a second lattice constant different from the first lattice constant, the second semiconductor layer being in junction contact with the first semiconductor layer to provide a strained semiconductor heterostructure, a magnitude of mismatch between the first and second lattice constants of the first and second semiconductor layers defining an energy splitting between a heavy hole band and a light hole band in the second semiconductor layer, such that the energy splitting is greater than a thermal noise energy in the second semiconductor layer in use, and (b) extracting the highly spin-polarized electron beam from the second semiconductor layer of the semiconductor device upon receiving the light energy.

In the spin-polarized electron beam producing process arranged as described above, the second semiconductor layer having the second lattice constant different from the first lattice constant of the first semiconductor layer, is in junction contact with the first layer, so as to provide a strained semiconductor heterostructure. Consequently, the lattice of the second layer is strained, and a band splitting occurs in the valence band of the second layer. More specifically, the valence band of the second layer has a subband of heavy hole (i.e., heavy hole band) and a subband of light hole (i.e., light hole band) and, if there is no strain in the lattice of the second layer, the energy levels of the two subbands are equal to each other at the lowest energy levels thereof. On the other hand, if there is a strain in the lattice of the second layer, an energy gap or splitting is produced between the energy levels of the two subbands. Meanwhile, the spin direction of the electrons excited from the heavy hole band is opposite to that of the electrons excited from the light hole band. Thus, if the second layer receives a light energy which excites only one of the heavy and light hole bands which band has the upper energy level, i.e., has the smaller energy gap with respect to the conduction band of the second layer, a number of electrons having their spins largely aligned in one of the two spin directions are excited in the second layer, so that a highly spin-polarized electron beam consisting of those electrons is emitted from the second layer. Furthermore, the strain of the lattice of the second layer is very stable since the strain is generated internally of the semiconductor device because of the heterostructure of the first and second layers whose lattice constants are different from each other. Thus, the highly spin-polarized electron beam emitted from the semiconductor device has a highly stable polarization and it is by no means interfered with by an external means for producing a strain in the lattice of the second layer. Meanwhile, if the energy splitting between the heavy and light hole bands is excessively small, electrons are excited from both the two bands because of thermal noise energy in the second layer, so that the electron beam emitted suffers from an insufficiently low polarization. In the semiconductor device, however, the magnitude of mismatch between the first and second lattice constants of the first and second layers is so determined to define an energy gap or splitting between the heavy and light hole bands such that the energy splitting is greater than the thermal noise energy in the second layer. Therefore, the excitation of electrons from one of the two bands which band has the lower energy level, is effectively prevented. Thus, a highly spin-polarized electron beam having a sufficiently high polarization is emitted from the semiconductor device.

According to a preferred feature of the first aspect of the invention, the first semiconductor layer of the semiconductor device is formed of a semiconductor crystal selected from the group consisting of gallium arsenide (GaAs) and gallium arsenide phosphide (GaAsP).

According to another feature of the first aspect of the invention, the second semiconductor layer of the semiconductor device is formed of a semiconductor crystal selected from the group consisting of gallium arsenide (GaAs), gallium arsenide phosphide (GaAsP), aluminum gallium arsenide (AlGaAs), indium gallium arsenide phosphide (InGaAsP), indium aluminum gallium phosphide (InAlGaP), and indium gallium phosphide (InGaP). The second layer is preferably grown with at least gallium and arsenic on the first layer by a known method.

According to yet another feature of the first aspect of the invention, the first semiconductor layer of the semiconductor device is formed of a semiconductor crystal selected from the group consisting of aluminum gallium arsenide (AlGaAs), indium gallium arsenide phosphide (InGaAsP), indium aluminum gallium phosphide (InAlGaP), and indium gallium phosphide (InGaP).

According to a further feature of the first aspect of the invention, the second lattice constant of the second semiconductor layer is greater than the first lattice constant of the first semiconductor layer. Alternatively, the second lattice constant of the second semiconductor layer may be smaller than the first lattice constant of the first semiconductor layer.

According to another feature of the first aspect of the invention, the highly spin-polarized electron beam has a not less than 50% spin polarization.

According to another feature of the first aspect of the invention, the energy splitting between the heavy and light hole bands in the second semiconductor layer is greater than the thermal noise energy in the second semiconductor layer at room temperature.

According to another feature of the first aspect of the invention, the light energy comprises a circularly polarized light having a selected wavelength. In this case, the selected wavelength may range from about 630 nm to about 890 nm, preferably from about 855 nm to about 870 nm.

According to another feature of the first aspect of the invention, one of opposite major surfaces of the second semiconductor layer provides a surface exposed to receive the light energy. The highly spin-polarized electron beam is emitted from the exposed surface of the second layer of the semiconductor device.

According to another feature of the first aspect of the invention, the process further comprises a step of treating the exposed major surface of the second semiconductor layer so that the exposed major surface is negative with respect to electron affinity.

According to another feature of the first aspect of the invention, the process further comprises a step of placing the semiconductor device in a vacuum housing.

According to another feature of the first aspect of the invention, the process further comprises a step of cooling the semiconductor device in use.

According to a second aspect of the present invention, there is provided a semiconductor device for emitting, upon receiving a light energy, a highly spin-polarized electron beam, comprising a first compound semiconductor layer formed of gallium arsenide phosphide, $GaAs_{1-x}P_x$, and having a first lattice constant; a second compound semiconductor layer provided on the first semiconductor layer, the second semiconductor layer having a second lattice constant different from the first lattice constant and a thickness, t, smaller than the thickness of the first semiconductor layer, the second semiconductor layer emitting the highly spin-polarized electron beam upon receiving the light energy; and a fraction, x, of the gallium arsenide phosphide $GaAs_{1-x}P_x$ of the first semiconductor layer defining a magnitude of mismatch between the first and second lattice constants, such that the magnitude of mismatch and the thickness t of the second semiconductor layer provide a residual strain, $\epsilon_R$, of not less than $2.0\times10^{-3}$ in the second semiconductor layer.

In the semiconductor device constructed as described above, the fraction x of the gallium arsenide phosphide $GaAs_{1-x}P_x$ of the first semiconductor layer is so selected as to define a magnitude of mismatch between the first and second lattice constants of the first and second layers, such that the magnitude of mismatch and the thickness t of the second semiconductor layer provide a residual strain, $\epsilon_R$, of not less than $2.0\times10^{-3}$ in the second layer. Therefore, the energy splitting, ΔE, produced in the valence band of the second layer becomes not less than 13 meV, so that a highly spin-polarized electron beam having a not less than 50% spin polarization is generated from the second layer of the semiconductor device.

According to a preferred feature of the second aspect of the invention, the second semiconductor layer is formed of gallium arsenide, GaAs. In this case, the fraction x of the gallium arsenide phosphide $GaAs_{1-x}P_x$ of the first semiconductor layer and the thickness t, in angstrom unit, of the second semiconductor layer may be so selected as to satisfy at least one of the following expressions:

$$t \leqq -18000x+8400,$$

and $$t \leqq -7000x+5100$$

According to another feature of the second aspect of the invention, the second semiconductor layer is formed of gallium arsenide phosphide, $GaAs_{1-y}P_y$. In this case, an absolute value of a fraction difference, $|x-y|$, of the gallium arsenide phosphides $GaAs_{1-x}P_x$, $GaAs_{1-y}P_y$ of the first and second semiconductor layers and the thickness t, in angstrom unit, of the second semiconductor layer may be so selected as to satisfy at least one of the following expressions:

$$t \leqq -18000\cdot|x-y|+8400,$$

and $$t \leqq -7000\cdot|x-y|+5100$$

According to yet another feature of the second aspect of the invention, the fraction difference $|x-y|$ defines the magnitude of mismatch between the first and second lattice constants such that the magnitude of mismatch and the thickness t provide the residual strain $\epsilon_R$ of not less than $2.6\times10^{-3}$ in the second semiconductor layer, the fraction difference $|x-y|$ and the thickness t in angstrom unit satisfying at least one of the following expressions:

$$t \leqq -12000\cdot|x-y|+6400,$$

and $$t \leqq -6000\cdot|x-y|+4600$$

In this case, the energy splitting ΔE produced in the valence band of the second layer is not less than 17 meV, so that a highly spin-polarized electron beam having a not less than 60% spin polarization is generated from the second layer of the semiconductor device.

According to a further feature of the second aspect of the invention, the fraction difference |x−y| defines the magnitude of mismatch between the first and second lattice constants such that the magnitude of mismatch and the thickness t provide the residual strain $\epsilon_R$ of not less than $3.5\times10^{-3}$ in the second semiconductor layer, the fraction difference |x−y| and the thickness t in angstrom unit satisfying at least one of the following expressions:

$$t\leq-10000\cdot|x-y|+5600,$$

and $$t\leq-6000\cdot|x-y|+4400$$

In this case, the energy splitting ΔE produced in the valence band of the second layer is not less than 23 meV, so that a highly spin-polarized electron beam having a not less than 70% spin polarization is generated from the second layer of the semiconductor device.

According to another feature of the second aspect of the invention, the fraction difference |x−y| defines the magnitude of mismatch between the first and second lattice constants such that the magnitude of mismatch and the thickness t provide the residual strain $\epsilon_R$ of not less than $4.6\times10^{-3}$ in the second semiconductor layer, the fraction difference |x−y| and the thickness t in angstrom unit satisfying the following expression:

$$t\leq-4000\cdot|x-y|+3400$$

In this case, the energy splitting ΔE produced in the valence band of the second layer is not less than 30 meV, so that a highly spin-polarized electron beam having a not less than 80% spin polarization is generated from the second layer of the semiconductor device.

According to another feature of the second aspect of the invention, the fraction difference |x−y| defines the magnitude of mismatch between the first and second lattice constants such that the magnitude of mismatch and the thickness t provide the residual strain $\epsilon_R$ of not less than $5.4\times10^{-3}$ in the second semiconductor layer, the fraction difference |x−y| and the thickness t in angstrom unit satisfying the following expressions:

$$t\leq-3000\cdot|x-y|+2800,$$

and $$t\leq-22000\cdot|x-y|-2200$$

In this case, the energy splitting ΔE produced in the valence band of the second layer is not less than 35 meV, so that a highly spin-polarized electron beam having a not less than 85% spin polarization is generated from the second layer of the semiconductor device.

In an advantageous embodiment of the semiconductor device according to the second aspect of the invention, the device further comprises a third compound semiconductor layer provided between the first and second semiconductor layers, wherein an energy gap between an energy level of a higher one of a heavy hole band and a light hole band of a valence band, and an energy level of a conduction band, of the second semiconductor layer is greater than that of the first semiconductor layer and smaller than that of the third semiconductor layer. In this case, the third semiconductor layer may be formed of a semiconductor crystal selected from the group consisting of aluminum gallium arsenide (AlGaAs), indium gallium phosphide (InGaP), and indium aluminum phosphide (InAlP).

According to another feature of the second aspect of the invention, the second semiconductor layer is formed of a semiconductor crystal selected from the group consisting of aluminum gallium arsenide (AlGaAs), indium gallium arsenide phosphide (InGaAsP), indium aluminum gallium phosphide (InAlGaP), and indium gallium phosphide (InGaP).

According to a third aspect of the present invention, there is provided a semiconductor device for emitting, upon receiving a light energy, a highly spin-polarized electron beam, comprising a first compound semiconductor layer formed of gallium arsenide phosphide, $GaAs_{1-x}P_x$, and having a first lattice constant; a second compound semiconductor layer formed of gallium arsenide phosphide, $GaAs_{1-y}P_y$, and provided on the first semiconductor layer, the second semiconductor layer having a second lattice constant different from the first lattice constant and a thickness, t, smaller than the thickness of the first semiconductor layer, the second semiconductor layer emitting the highly spin-polarized electron beam upon receiving the light energy; and an absolute value of a fraction difference, |x−y|, of the gallium arsenide phosphides $GaAs_{1-x}P_x$, $GaAs_{1-y}P_y$ of the first and second semiconductor layers defining a magnitude of mismatch between the first and second lattice constants, such that the magnitude of mismatch and the thickness t of the second semiconductor layer provide a residual strain, $\epsilon_R$, of not less than $2.0\times10^{-3}$ in the second semiconductor layer.

In the semiconductor device according to the third aspect of the invention, the fraction difference |x−y| of the gallium arsenide phosphides $GaAs_{1-x}P_x$, $GaAs_{1-y}P_y$ of the first and second layers is so selected as to define a magnitude of mismatch between the first and second lattice constants of the first and second layers, such that the magnitude of mismatch and the thickness t of the second layer provide a residual strain, $\epsilon_R$, of not less than $2.0\times10^{-3}$ in the second layer. Thus, the energy splitting ΔE produced due to the degeneracy in the valence band of the second layer is not less than 13 meV. Therefore, the electron beam emitted from the present semiconductor device enjoys a not less than 50% spin polarization.

According to a fourth aspect of the present invention, there is provided a semiconductor device for emitting, upon receiving a light energy, a highly spin-polarized electron beam, comprising: a first compound semiconductor layer having a first lattice constant; and a second compound semiconductor layer formed of aluminum gallium arsenide, $Al_xGa_{1-x}As$, and provided on said first semiconductor layer, said second semiconductor layer having a second lattice constant different from said first lattice constant, said second semiconductor layer emitting said highly spin-polarized electron beam upon receiving said light energy.

In the semiconductor device constructed as described above, the aluminum gallium arsenide $Al_xGa_{1-x}As$ of the second layer has a greater energy gap with respect to the conduction band, than that of the gallium arsenide (GaAs) crystal. Therefore, a maximum spin polarization is obtained from the $Al_xGa_{1-x}As$ crystal (i.e., second layer), by using an excitation light having a wavelength smaller or shorter than that for the GaAs crystal. Thus, a highly spin-polarized electron beam may be extracted from the present device, by using an excitation light having a wavelength of about 780 to 830 nm, which may be an excitation laser beam emitted by, e.g., a small-size and low-price semiconductor laser. The wavelength of light at which the maximum spin polarization is obtained from the $Al_xGa_{1-x}As$ crystal may be changed, e.g., reduced to about about 780 to 830 nm, by changing the proportion, x, of aluminum contained in the $Al_xGa_{1-x}As$ crystal. Additionally, the $Al_xGa_{1-x}As$ crystal of the second layer has a lattice constant equal to, or greater than, that of the GaAs crystal. Therefore, in the case where the first layer is provided on a substrate formed of the GaAs crystal, it is possible to provide a great mismatch between the lattice constants of the crystals of the first and second layers, thereby producing a great energy difference or splitting between the heavy hole and light hole subbands of the valence band, while at the same time providing a small lattice mismatch between the crystals of the first layer and the substrate. Thus, the electron beam emitted from the present semiconductor device enjoys high quantum efficiency and high spin polarization.

According to a preferred feature of the fourth aspect of the invention, the semiconductor device further comprises a thin film provided on said second semiconductor layer. In this case, the thin film may be formed of a material selected from the group consisting of gallium arsenide (GaAs) and arsenic (As). In the case where the thin film is formed of gallium arsenide (GaAs), the $Al_xGa_{1-x}As$ second layer and the GaAs film more effectively prevent the reduction of quantum efficiency of the electron beam than the gallium arsenide phosphide ($GaAs_{1-y}P_y$) crystal. In addition, the GaAs film serves as a passivation film, i.e., an oxidization-preventing film for preventing the oxidization of aluminum contained in the $Al_xGa_{1-x}As$ crystal (i.e., second layer). If the aluminum of the $Al_xGa_{1-x}As$ crystal is oxidized, an insulator film is produced on the exposed surface of the $Al_xGa_{1-x}As$ crystal, so that the insulator film blocks the extraction of electron beam from the second layer. Meanwhile, in the case where the thin film is formed of arsenic (As), the As film prevents the oxidization of aluminum of the $Al_xGa_{1-x}As$ crystal in atmosphere. Although the As film blocks the extraction of electron beam from the second layer, the As film becomes unnecessary after the chamber in which the semiconductor device is set for its use is placed under a high vacuum. Hence, the As film is removed by, e.g., being evaporated just before the semiconductor device is actually used in the spin-polarized electron beam emitting system.

BRIEF DESCRIPTION OF THE DRAWINGS

The above and optional objects, features and advantages of the present invention will be better understood by reading the following detailed description of the presently preferred embodiments of the invention when considered in conjunction with the accompanying drawings, in which.

DETAILED DESCRIPTION OF THE PREFERRED EMBODIMENTS

Figure 1:
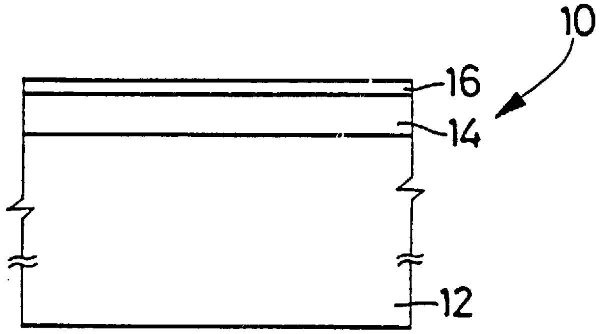
FIG. 1 is a view for illustrating the multiple-layer structure of a spin-polarized electron beam emitting device embodying the present invention.

Referring first to FIG. 1, there is shown a spin-polarized electron beam emitting device 10 in accordance with the present invention. The device 10 includes a gallium arsenide (GaAs) semiconductor crystal substrate 12. On the GaAs substrate 12, a crystal of gallium arsenide phosphide ($GaAs_{1-x}P_x$), and subsequently a crystal of gallium arsenide (GaAs), are grown by a well-known MOCVD (metal organic chemical vapor deposition) method, to provide a first and second compound semiconductor layer 14, 16, respectively. The GaAs substrate 12 has a thickness of about 350 μm. Impurities such as zinc (Zn) are doped into the GaAs substrate 12, so as to provide a p-type GaAs semiconductor monocrystalline substrate (p-GaAs) having a carrier concentration of about $5\times10^{18}$ ($cm^{-3}$). The GaAs substrate 12 has a (100) plane face. The $GaAs_{1-x}P_x$ layer 14 grown on the GaAs substrate 12 has a thickness of about 2.0 μm. Impurities such as zinc are doped into the $GaAs_{1-x}P_x$ layer 14, so as to provide a p-type $GaAs_{1-x}P_x$ semiconductor monocrystalline layer (p-$GaAs_{1-x}P_x$) having a carrier concentration of about $5\times10^{18}$ ($cm^{-3}$). The GaAs layer 16 has a predetermined thickness, t. Impurities such as zinc are doped into the GaAs layer 16, so as to provide a p-type GaAs semiconductor monocrystalline layer (p-GaAs) having a carrier concentration of about $5\times10^{18}$ ($cm^{-3}$). The GaAs layer (second compound semiconductor layer) 16 has no oxidation treatment film or the like on the exposed surface thereof.

A fraction, x, of the $GaAs_{1-x}P_x$ layer (first compound semiconductor layer) 14 and a thickness, t, of the GaAs layer 16 are determined so as to provide a residual strain, $\epsilon_R$, of not less than $2.0\times10^{-3}$ in the GaAs layer 16. More specifically, the fraction x and the thickness t in angstrom unit take respective values which satisfy the following approximate expression (1) or (2):

$$t \leqq -18000x+8400 \quad (1)$$

$$t \leqq -7000x+5100 \quad (2)$$

The actual thickness t of the GaAs layer 16 exceeds a critical thickness, $t_c$, for the coherent growth thereof. However, since the GaAs layer 16 has a lattice constant different from that of the $GaAs_{1-x}P_x$ layer 14, the GaAs layer 16 cooperates with the $GaAs_{1-x}P_x$ layer 14 with which the GaAs layer 16 is in junction contact, to provide a strained semiconductor heterostructure in which the GaAs layer 16 has a strain in the lattice thereof. Because of the strained lattice of the GaAs layer 16, an energy splitting, ΔE, is produced due to the degeneracy between the energy level of a subband of heavy hole (heavy hole band) and the energy level of a subband of light hole (light hole band) in the valence band of the GaAs layer 16.

The critical thickness $t_c$ indicates an upper limit under which a magnitude of mismatch between the lattices of the two layers 14, 16 would be accommodated only by an elastic strain produced in the GaAs layer 16. The critical thickness $t_c$ is defined by the following expression (3):

$$t_c = \frac{b}{4\pi f} \cdot \frac{(1+\nu/4)}{(1+\nu)} \left( \ln\frac{t_c}{b} + 1 \right) \quad (3)$$

wherein b: magnitude of Burgers vector,

ν: Poisson's ratio, and f: a ratio of the magnitude of mismatch between the lattice constants of the two layers 14, 16 with respect to the lattice constant of the $GaAs_{1-x}P_x$ layer 14.

Concerning an example in which b=4 angstroms (Å), ν=0.31, and f=0.006, a critical thickness $t_c$ is about 200 angstroms.

Figure 2:
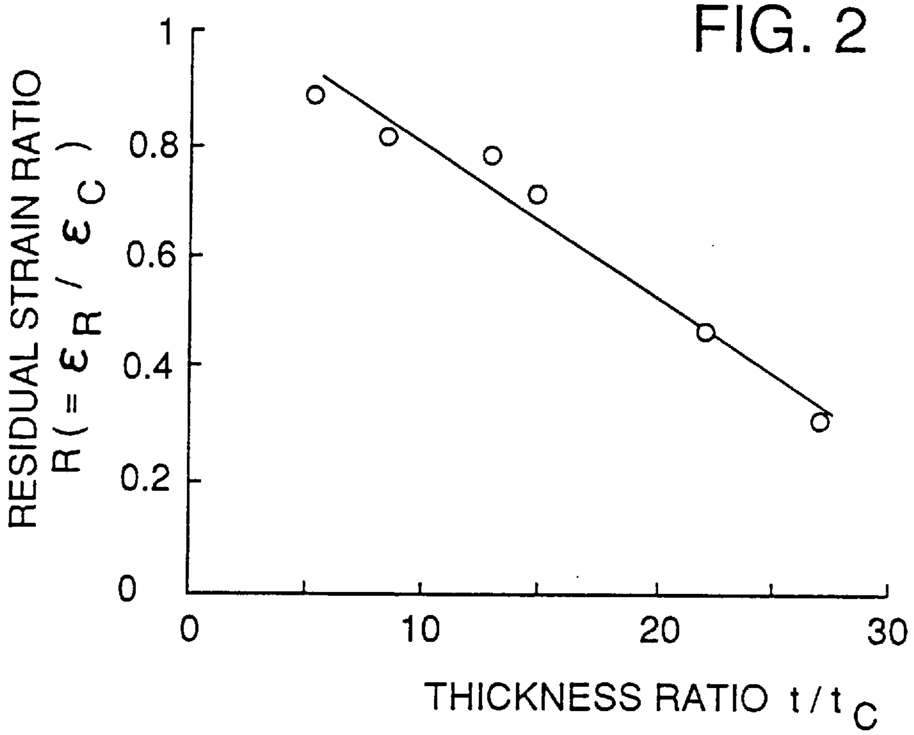
FIG. 2 is a graph representing a relationship between a ratio, $t/t_c$, of an actual thickness, t, of a GaAs layer of the device of FIG. 1 to a critical thickness, $t_c$, thereof, and a residual strain ratio, R, of the GaAs layer.

The above-indicated parameter f is defined by the fraction x of the $GaAs_{1-x}P_x$ crystal of the first layer 14. Meanwhile, experiments conducted by the Inventors have elucidated that the relationship between a ratio, $t/t_c$, of the actual thickness t of the GaAs layer 16 to the critical thickness $t_c$, and a residual strain ratio, R, of the GaAs layer 16 is linear as shown in FIG. 2. The residual strain ratio R is a ratio of an actual residual strain, $\epsilon_R$, in the GaAs layer 16 to a strain, $\epsilon_C$, of a reference GaAs layer which is assumed to be grown coherently.

In addition, the relationship between the energy splitting ΔE of the valence band of the GaAs layer 16, and the actual residual strain $\epsilon_R$ of the GaAs layer 16, is generally defined by the following expression (4):

$$\Delta E = 6.5\epsilon_R \text{ (eV)} \quad (4)$$

Figure 3:
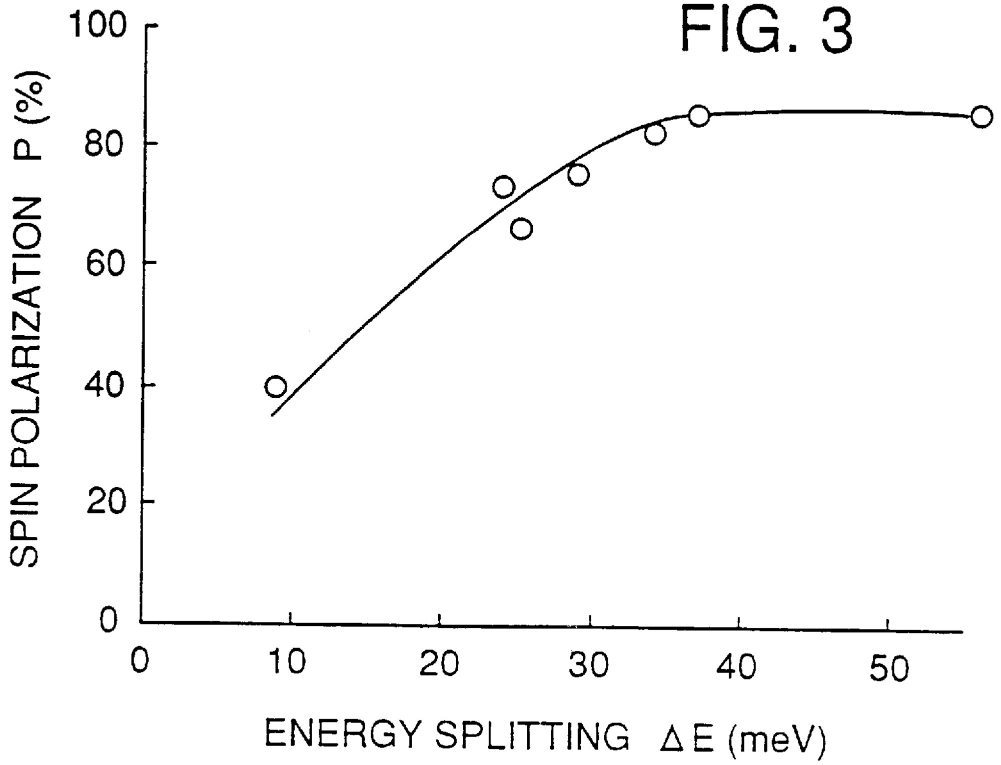
FIG. 3 is a graph representing a relationship between an energy splitting, ΔE, of the valence band of the GaAs layer of the device of FIG. 1, and a spin polarization, P, of an electron beam emitted from the device.

Meanwhile, experiments conducted by the Inventors have shown, as indicated in FIG. 3, that the relationship between the energy splitting ΔE of the valence band of the GaAs layer 16, and the spin polarization P of the electron beam emitted from the semiconductor device 10, is linear under the level of about 35 meV of the energy splitting ΔE, and that the spin polarization P is saturated at the level of 35 meV.

Figure 4:
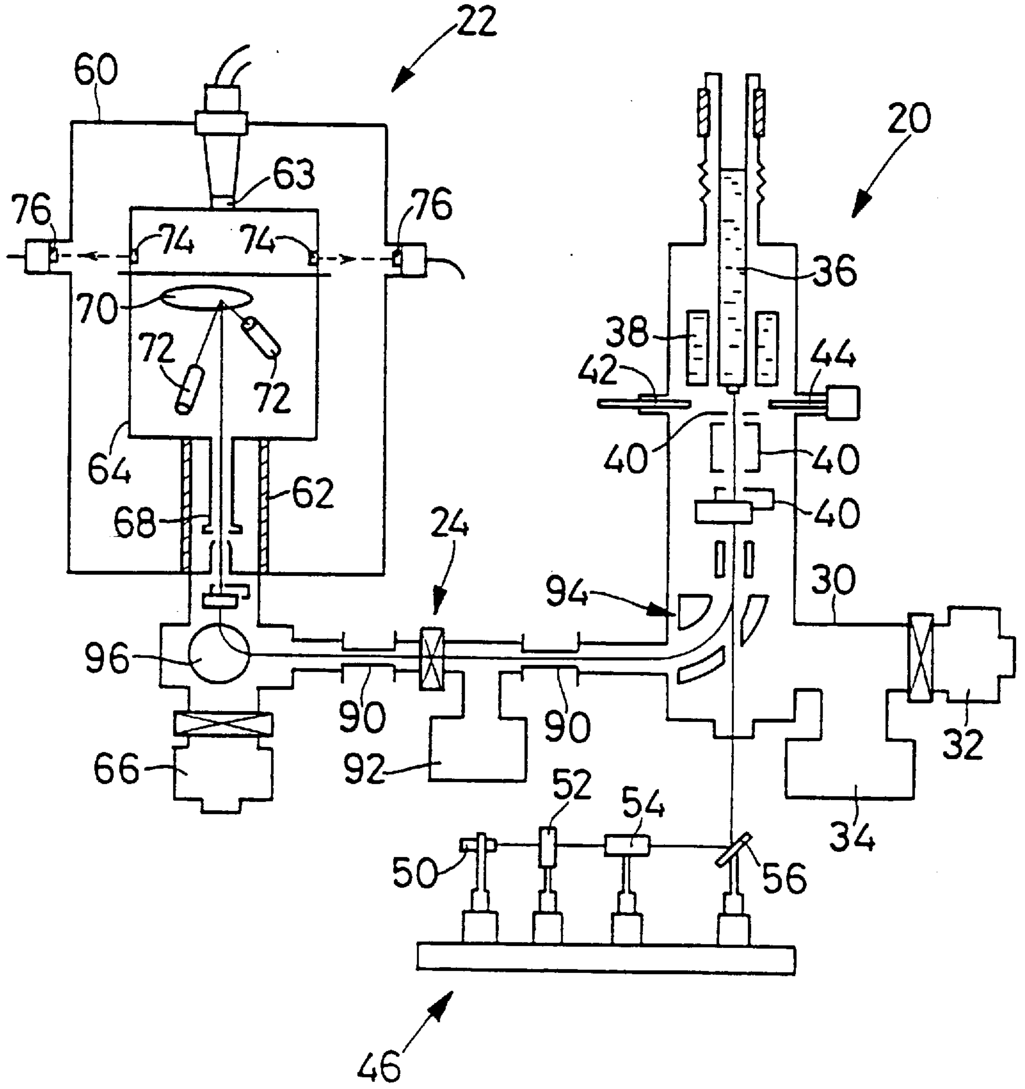
FIG. 4 is a view of an apparatus for measuring a spin polarization P of an electron beam emitted from the device of FIG. 1.

The above-indicated spin polarization P is measured by, for example, an apparatus as shown in FIG. 4. The semiconductor device 10 is disposed in a gun assembly 20 for producing a spin-polarized electron beam. The apparatus further includes, in addition to the gun assembly 20, a polarization analyzer 22 for measuring a polarization (degree of polarity) of the electron beam emitted from the electron gun 20, and a transmission assembly 24 for transmitting the electron beam emitted from the gun 20, to the polarization analyzer 22.

The gun assembly 20 includes a vacuum housing 30 for providing a high vacuum chamber, a turbo-molecular pump 32 and an ion pump 34 for sucking gas from the vacuum housing 30 and thereby placing the housing 30 under a high vacuum of about $10^{-9}$ torr, a first container 36 for holding the semiconductor device 10 in the vacuum housing 30 and accommodating liquid nitrogen for cooling the device 10, and a second container 38 surrounding the first container 36, for accommodating liquid nitrogen for condensing residual gas in the housing 30, on the surface thereof. The gun assembly 20 further includes a plurality of extraction electrodes 40 for extracting electrons from the surface of the semiconductor device 10, a cesium (Cs) activator 42 and an oxygen ($O_2$) activator 44 for emitting cesium and oxygen toward the surface of the device 10, respectively, and a laser beam generator 46 for applying a laser beam to the surface of the device 10. The laser beam generator 46 includes a tunable laser beam source 50 for generating a laser beam having a selected wavelength of 700 to 900 nm, and a polarizer 52 for transmitting only a linearly polarized light therethrough, a quarter wavelength element 54 for converting the linearly polarized light to a circularly polarized light, and a mirror 56 for directing the circularly polarized light toward the surface of the semiconductor device 10.

The polarization analyzer 22 includes a high-voltage tank (Mott's scattering tank) 64 which is disposed in a gas tank 60 filled with Freon and is supported by a high-voltage insulator 62, and to which a 100 kV electric voltage is applied through an anode 63. The analyzer 22 further includes a turbo-molecular pump 66 for sucking gas from the high-voltage tank 64 and thereby placing the tank 64 under a high vacuum of about $10^{-6}$ torr, an accelerator electrode 68 for accelerating the spin-polarized electron beam, a gold (Au) foil 70 which is supported by a disk (not shown) and to which the spin-polarized electron beam is incident, a pair of surface barrier detectors 72 for detecting electrons scattered in the direction of θ=120° as a result of collision of the electron beam with atomic nuclei of the Au foil 70, a pair of light emitting diodes (LED) 74 each for converting, to a light, an electric signal generated by a corresponding one of the surface barrier detectors 72 and subsequently amplified by a corresponding one of two pre-amplifiers 84 (FIG. 5), and a pair of light detectors 76 each for receiving the light emitted by a corresponding one of the LEDs 74 and converting the light into an electric signal.

Figure 5:
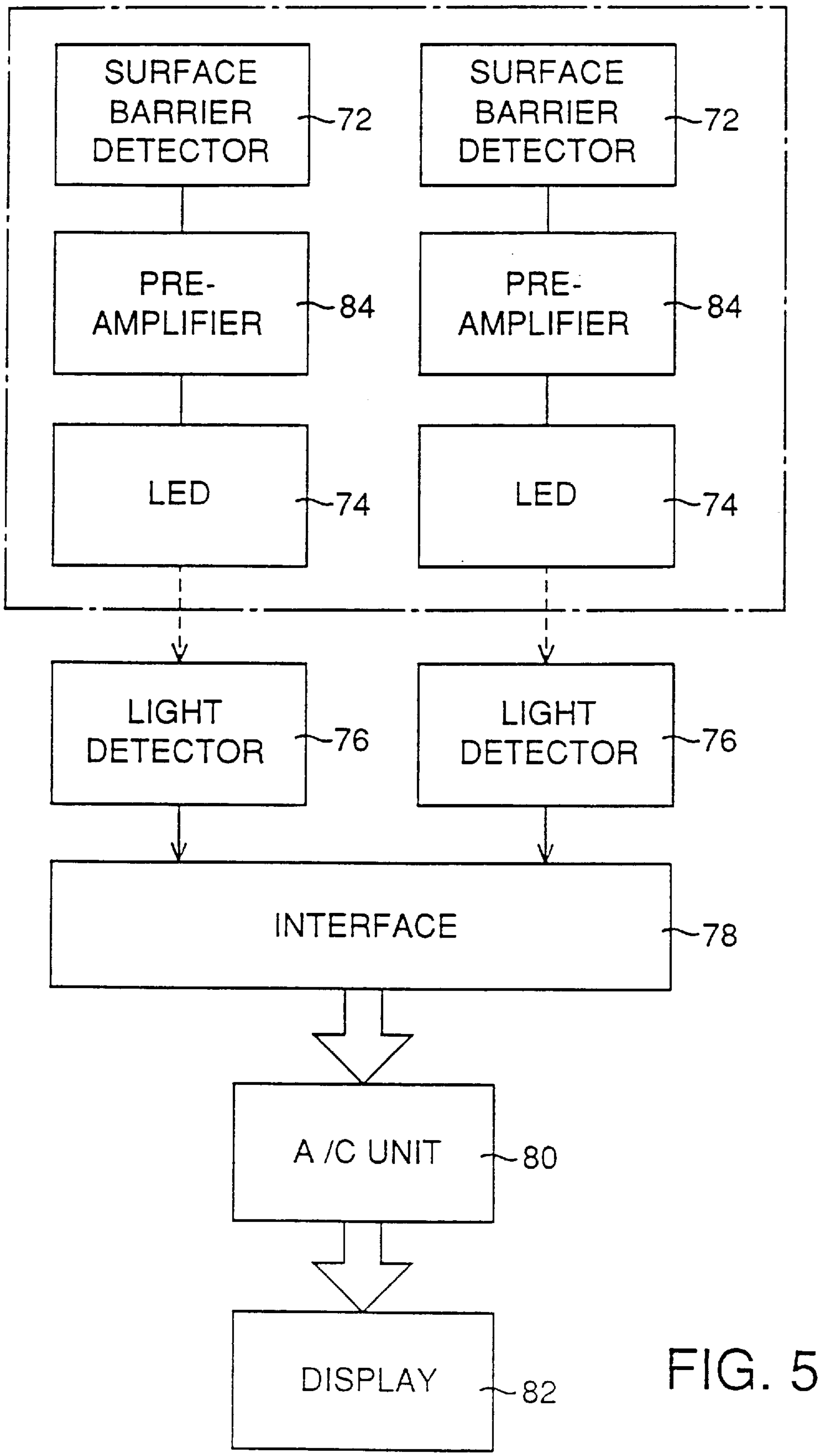
FIG. 5 is a diagrammatic view of the electric configuration of the apparatus of FIG. 4.

FIG. 5 shows an electric circuit for determining a spin polarization of the electron beam emitted from the gun assembly 22 or semiconductor device 10, based on the electric signals supplied through the two channels from the two surface barrier detectors 72. In the figure, an electric signal from each of the surface barrier detectors 72 is amplified by the corresponding pre-amplifier 84 and subsequently is converted by the corresponding LED 74 into a light signal, which signal in turn is converted by the corresponding light detector 76 into an electric signal. This electric signal is supplied to an arithmetic and control (A/C) unit 80 via an interface 78. The A/C unit 80 calculates a polarization of the electron beam incident to the Au foil 70, based on the supplied signals, according to pre-stored arithmetic expressions or software programs, and commands a display 82 to indicate the calculated polarization value.

Back to FIG. 4, the transmission assembly 24 includes a pair of conductance reducing tubes 90 disposed midway in a duct passage connecting between the vacuum housing 30 and the high-voltage tank 64, an ion pump 92 disposed at a position between the pair of tubes 90, and a spherical condenser 94 for electrostatically bending the electron beam extracted from the semiconductor device 10, by a right angle toward the high-voltage tank 64. The transmission assembly 24 further includes a Helmholtz coil 96 for magnetically bending the electron beam by a right angle toward the high-voltage tank 64. In the case where the vacuum housing 30 and the high-voltage tank 64 have a relative positional relationship which does not require bending of the electron beam, it is not necessary to employ the spherical condenser 94 or the Helmholtz coil 96.

As described above, the semiconductor device 10 used in the apparatus of FIG. 4 has no oxidation treatment film on the exposed surface of the GaAs layer 16. Therefore, from the time immediately after the GaAs layer 16 is grown on the $GaAs_{1-x}P_x$ layer 14, it is required that the semiconductor device 10 be kept in a vacuum desiccator. First, this semiconductor device 10 is fixed to the lower end of the first container 36, and subsequently the vacuum housing 30 is brought into a high vacuum of about $10^{-9}$ torr and then is heated at about 420° C. for about fifteen minutes by a heater (not shown). Thus, the surface of the semiconductor device 10 is cleaned. Next, the cesium activator 42 and the oxygen activator 44 are operated for alternately emitting cesium and oxygen toward the surface of the semiconductor device 10, so that a small amount of cesium and oxygen is deposited to the device 10. Thus, the surface of the device 10 is made negative with respect to electron affinity (generally referred to as the "NEA"). The NEA means that the energy level of an electron in the bottom of the conduction band at the surface of the GaAs layer 16 is higher than the energy level of an electron in vacuum. Third, at room temperature, i.e., without cooling the device 10 by the liquid nitrogen, the laser generator 46 is operated for emitting a circularly polarized laser beam toward the device 10. Upon injection of the laser beam into the device 10, the device 10 emits a number of electrons whose spins are largely aligned in one direction, and which are extracted as a highly spin-polarized electron beam by the extraction electrodes 40. This electron beam is transmitted by the transmission assembly 24, so as to be incident to the Au foil 70 of the high-voltage tank 64. Then, a spin polarization of the electron beam is measured by the electric circuit shown in FIG. 5.

Figure 6:
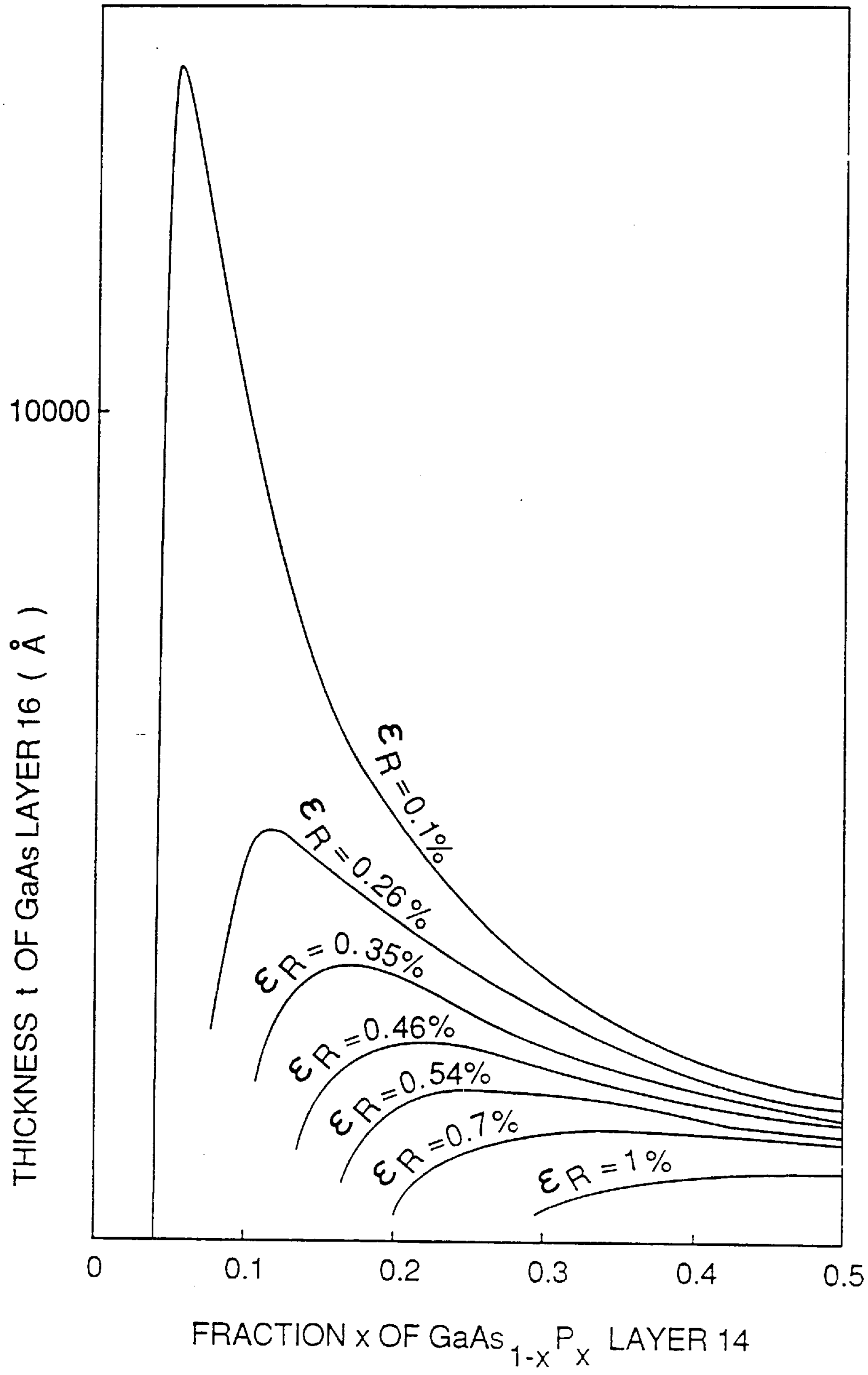
FIG. 6 is a graph representing the relationship between a fraction, x, of gallium arsenide phosphide, $GaAs_{1-x}P_x$, as another layer of the device of FIG. 1, and the thickness t of the GaAs layer of the device, as a residual strain, $\epsilon_R$, in the GaAs layer is varied as a parameter.

The coherent strain $\epsilon_c$ of the GaAs layer 16 is known in the art. Therefore, if the actual thickness t of the GaAs layer 16 and the fraction x of the $GaAs_{1-x}P_x$ layer 14 are given, a residual strain $\epsilon_R$ of the GaAs layer 16 can be determined according to the relationship shown in FIG. 2. FIG. 6 shows relationships between these three variables, x, t and $\epsilon_R$. More specifically, various curves shown in the graph of FIG. 6 represent corresponding relationships between the fraction x and the thickness t, as the residual strain $\epsilon_R$ is varied as a parameter. Since the energy splitting ΔE due to the degeneracy in the valence band of the GaAs layer 16 is defined by the residual strain $\epsilon_R$ according to the above-indicated expression (4), the relationship between the polarization P of the electron beam and the residual strain $\epsilon_R$, and the relationship between the polarization P and the fraction x or thickness t, are determined based on the curve shown in FIG. 3. Table I indicates respective values of the energy splitting ΔE, residual strain $\epsilon_R$, fraction x, and thickness t, when the polarization P takes 50%, 60%, 70%, 80% or 85%.

TABLE I

| | ΔE (meV) | $\epsilon_R$ | Conditional Expression of x and t (t in angstrom unit) |
|---|---|---|---|
| ≧50% | ≧13 | $\geqq 2.0 \times 10^{-3}$ | t ≦ −18000x + 8400 or t ≦ −7000x + 5100 |
| ≧60% | ≧17 | $\geqq 2.6 \times 10^{-3}$ | t ≦ −12000x + 6400 or t ≦ −6000x + 4600 |
| ≧70% | ≧23 | $\geqq 3.5 \times 10^{-3}$ | t ≦ −10000x + 5600 or t ≦ −6000x + 4400 |
| ≧80% | ≧30 | $\geqq 4.6 \times 10^{-3}$ | t ≦ −4000x + 3400 |
| ≧85% | ≧35 | $\geqq 5.4 \times 10^{-3}$ | t ≦ −3000x + 2800 and t ≦ 22000x − 2200 |

It emerges from the foregoing that, in order to obtain, for example, a not less than 50% polarization of an electron beam emitted from the semiconductor device 10, the fraction x and thickness t are selected at respective values each positioned on or under a curve (not shown in FIG. 6) representing a relationship between the variables x, t in the case where the residual strain $\epsilon_R$ is 0.2%. In order to obtain a not less than 60% polarization, the fraction x and thickness t are selected at respective values each on or under the curve, shown in FIG. 6, representing the relationship between the variables x, t in the case where the residual strain $\epsilon_R$ is 0.26%. In order to obtain a not less than 70% polarization, the fraction x and thickness t are selected at respective values each on or under the curve of the x, t relationship in the case where the residual strain $\epsilon_R$ is 0.35%. In order to obtain a not less than 80% polarization, the fraction x and thickness t are selected at respective values each on or under the curve of the x, t relationship in the case where the residual strain $\epsilon_R$ is 0.46%. In order to obtain a not less than 85% polarization, the fraction x and thickness t are selected at respective values each on or under the curve of the x, t relationship in the case where the residual strain $\epsilon_R$ is 0.54%.

The conditional expressions for the fraction x and thickness t, indicated in the TABLE I, represent respective areas each of which approximates a corresponding one of the actual areas defined by (i.e., located on or under) the respective curves shown in FIG. 6. For example, concerning the conditional expression, t≦−12000x+6400 or t≦−6000x+4600, for obtaining a not less than 60% polarization, the equations, t=−12000x+6400 and t=−6000x+4600, represent two straight lines which cooperate with each other to approximate the curve representative of the x, t relationship, shown in FIG. 6, for the case where the residual strain $\epsilon_R$ is 0.26%. Therefore, in this case, for practical purposes, the fraction x and thickness t are selected at respective values each on or under the straight line defined by either one of the two equations.

Thus, in the semiconductor device 10 in accordance with the present invention, the fraction x of the gallium arsenide phosphide mixed-crystal $GaAs_{1-x}P_x$ of the first semiconductor layer 14 is so selected as to define a difference, i.e., magnitude of mismatch, between the lattice constants of the two semiconductor crystals, such that the magnitude of mismatch and the thickness t of the second semiconductor layer 16 provide a residual strain, $\epsilon_R$, of not less than $2.0\times10^{-3}$ in the second semiconductor layer 16. As described above, for practical purposes, the fraction x and thickness t are determined to satisfy the above-indicated approximation (1) or (2). Therefore, the energy splitting ΔE due to the degeneracy in the valence band of the GaAs layer 16 is required to be not less than 13 meV, so that an electron beam emitted from the device 10 has a not less than 50% polarization.

While the illustrated semiconductor device 10 is produced by superposing, on the GaAs substrate 12, the $GaAs_{1-x}P_x$ layer (first layer) 14 and the GaAs layer (second layer) 16, it is possible to use, in place of the gallium arsenide (GaAs), other sorts of materials for a substrate 12. In addition, it is possible to interpose another semiconductor layer between the substrate 12 and the first layer 14. In the latter case, those three semiconductor layers may be formed to have different lattice constants, so that the three layers cooperate with each other to provide a semiconductor heterostructure.

In the illustrated semiconductor device 10, the fraction x of the $GaAs_{1-x}P_x$ of the first layer 14 is so determined as to define a magnitude of mismatch between the lattice constants of the two layers, such that the magnitude of mismatch and the thickness t of the second layer 16 provide a residual strain $\epsilon_R$ of not less than $2.0\times10^{-3}$ in the second layer 16. However, it is preferred that the fraction x and the thickness t be determined to provide, in the second layer 16, a residual strain $\epsilon_R$ of not less than $2.6\times10^{-3}$, more preferably not less than $3.5\times10^{-3}$, still more preferably not less than $4.6\times10^{-3}$, and most preferably not less than $5.4\times10^{-3}$.

EXAMPLE 1

The semiconductor device of FIG. 1 is manufactured such that the fraction x of the $GaAs_{1-x}P_x$ of the first layer 14 and the thickness t of the gallium arsenide (GaAs) of the second layer 16 are 0.17 ($GaAs_{0.83}P_{0.17}$) and about 850 angstroms (Å), respectively. In this example, the lattice constants of the first and second layers 14, 16 differ from each other by about 0.6%. Therefore, the second layer 16 cooperates with the first layer 14 with which the second layer 16 is in junction contact, to provide a semiconductor heterostructure such that the lattice of the GaAs crystal of the second layer 16 has a strain. Because of the strained GaAs crystal lattice, an energy gap or splitting ΔE is produced between the energy levels of the heavy and light hole bands (subbands) in the valence band of the second layer 16. This energy splitting ΔE is greater than a thermal noise energy, $E_o$, generated when the semiconductor device 10 is being used. The thermal noise energy $E_o$ is defined by the following expression:

$$E_o=kT$$

wherein k: Boltzmann's constant, and

T: absolute temperature

In the present example, the energy splitting ΔE is about 40 meV, which value is sufficiently greater than the thermal noise energy of about 26 meV at room temperature (25° C.). Since the critical thickness $t_c$ of the second layer 16 of the device 10 of FIG. 1 is about 200 angstroms as described previously, the actual thickness, 850 angstroms, of the second layer 16 is about four times greater than the critical thickness $t_c$.

Figure 7:
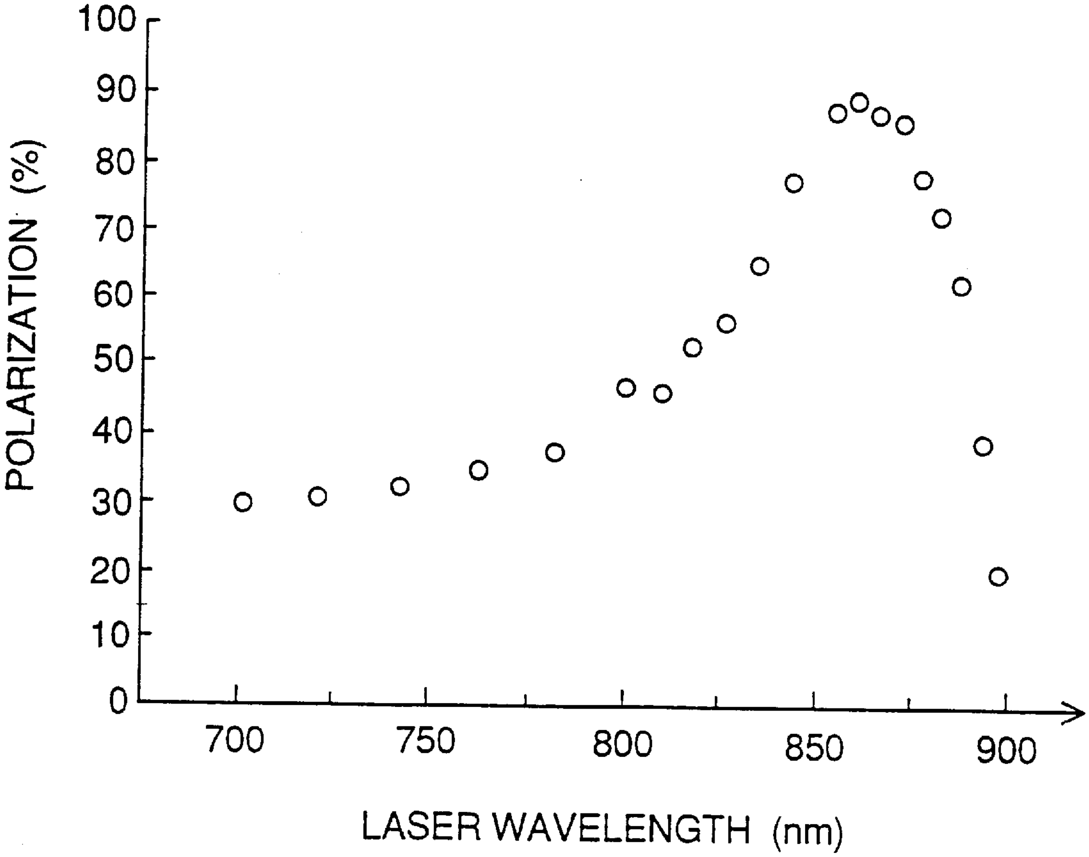
FIG. 7 is a graph representing the spin polarization values measured by the apparatus of FIG. 4.
Figure 8:
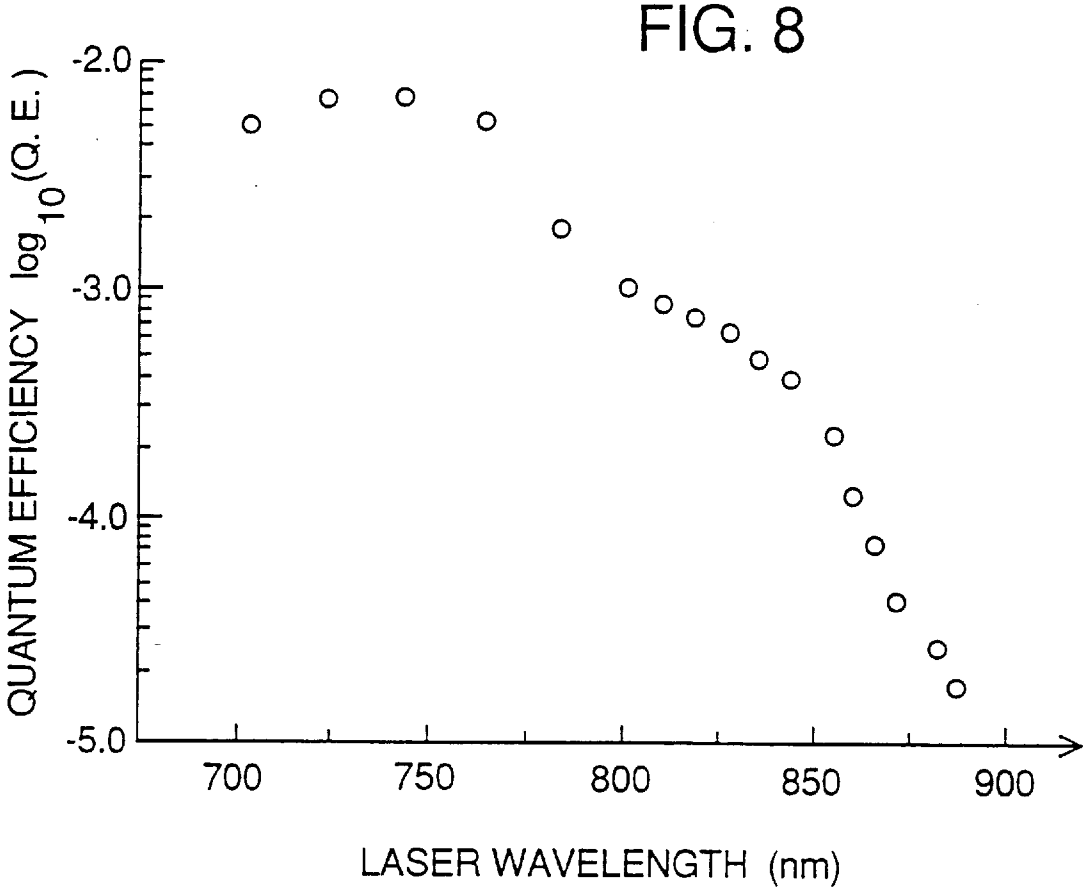
FIG. 8 is a graph representing the quantum efficiency (Q.E.) values measured when electron beams are emitted from the device of FIG. 1 incorporated by the apparatus of FIG. 4.

Experiments which the Inventors have conducted have shown that the spin polarization of an electron beam emitted from a conventional device (i.e., device manufactured by growing a p-GaAs layer on a p-GaAs substrate, that is, device equivalent to a device which would be obtained by removing the first layer 14 from the present device 10), is about 43%. On the other hand, the spin polarization of an electron beam emitted from the present device 10 (Example 1) is about 86% at the excitation laser wavelengths of 855 to 870 nm, as shown in FIG. 7. The present device 10 is observed with quantum efficiency (Q.E.) of about $2\times10^{-4}$ at the laser wavelengths of 855 to 870 nm, as shown in FIG. 8.

As is apparent from the foregoing, in the present device 10, the first and second layers 14, 16 cooperate with each other to provide a semiconductor heterostructure, so that the lattice of the second layer 16 is strained. Consequently, an energy splitting ΔE is produced between the energy levels of the heavy and light hole bands in the valence band of the second layer 16. Therefore, if a light energy which excites only an electron from one of the two bands which has the upper energy level (in the present example, the heavy hole band) is injected into the second layer 16, that is, if a photon with a 855 to 870 nm wavelength is injected into the second layer 16, a number of electrons whose spins are aligned in one of the two spin directions are emitted from the second layer 16 or device 10. Although the thickness t of the second layer 16 is greater than the critical thickness $t_c$, the magnitude of mismatch between the lattice constants of the first and second layer crystals 14, 16 is sufficiently large. Therefore, the second layer crystal 16 has a sufficiently great strain, so that the energy splitting ΔE between the heavy and light hole bands is greater than the thermal noise energy and that the excitation of an electron from the light hole band is effectively controlled or prevented. As a result, the present device 10 enjoys an excellent spin polarization of 86%.

EXAMPLE 2

Figure 9:
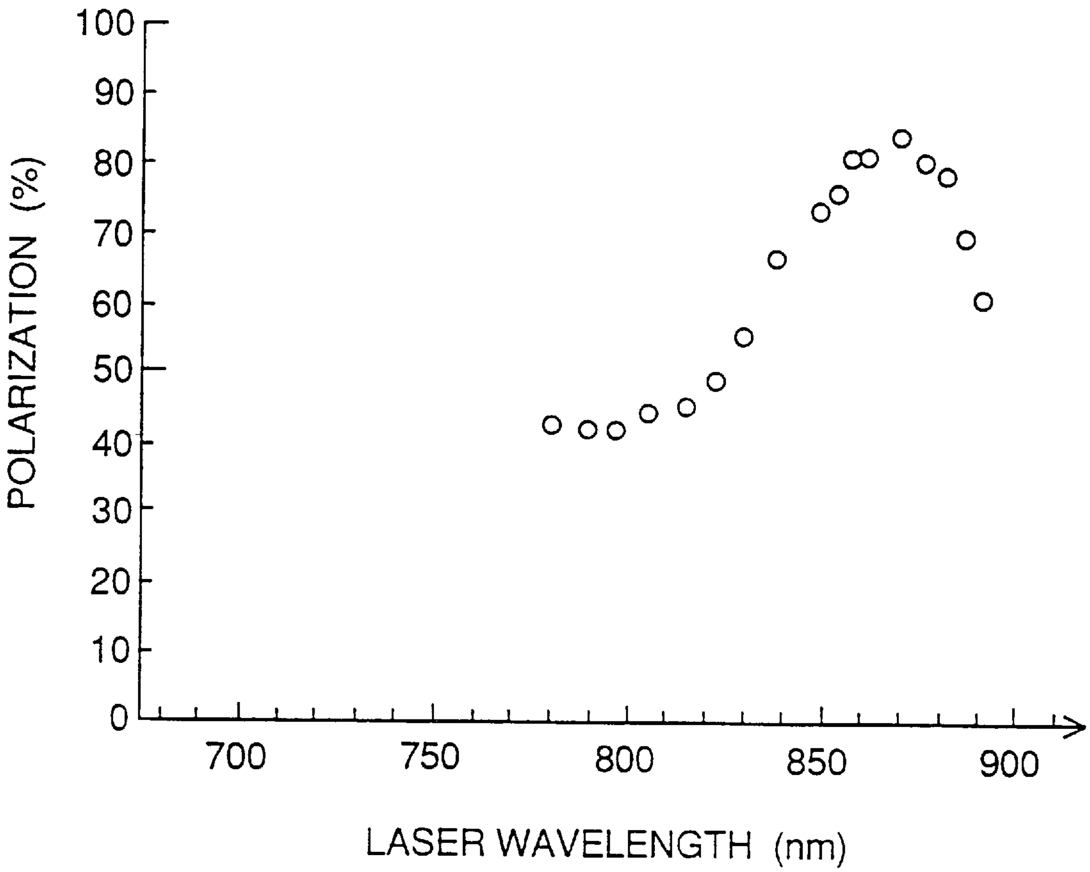
FIG. 9 is a graph representing the spin polarization values measured with respect to another spin-polarized electron beam emitting device embodying the present invention.
Figure 10:
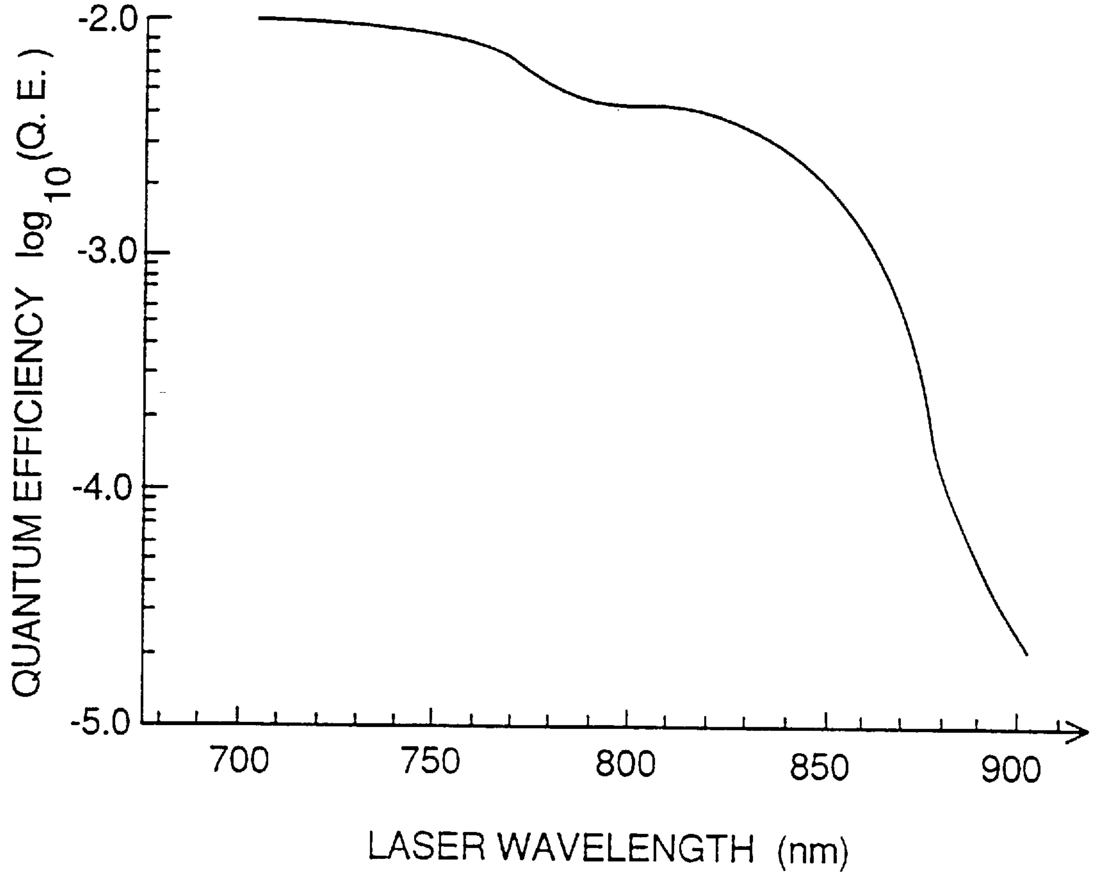
FIG. 10 is a graph representing the quantum efficiency (Q.E.) values measured with respect to the device used in the measurement shown in FIG. 9.

In this example, the semiconductor device of FIG. 1 is manufactured such that the fraction x of the $GaAs_{1-x}P_x$ of the first layer 14 is the same as that of Example 1 but that the thickness t of the gallium arsenide (GaAs) of the second layer 16 is about 1400 angstroms, which value is about seven times greater than the critical thickness $t_c$. The spin polarization and quantum efficiency with this example are shown in the graphs of FIGS. 9 and 10. As can be seen from the graphs, the polarization and quantum efficiency are about 83% and about $8\times10^{-4}$, respectively, at the laser wavelengths of 855 to 870 nm.

EXAMPLE 3

In the third example, the semiconductor device of FIG. 1 is manufactured such that the fraction x of the $GaAs_{1-x}P_x$ of the first layer 14 is 0.13 ($GaAs_{0.87}P_{0.13}$) and that the thickness t of the gallium arsenide (GaAs) of the second layer 16 is about 3100 angstroms. Like Examples 1 and 2, spin polarization and quantum efficiency are measured on Example 3. The polarization and quantum efficiency measured are about 67% and about $1\times10^{-3}$, respectively, at the laser wavelengths of 855 to 870 nm. Table II shows the measurements of polarization and quantum efficiency of Examples 1 to 3.

TABLE II

| | Example 1 | Example 2 | Example 3 |
|---|---|---|---|
| Fraction x | 0.17 | 0.17 | 0.13 |
| Thickness t (Å) | 850 | 1400 | 3100 |
| Polarization (%) | 86 | 83 | 67 |
| Quantum Efficiency | $2 \times 10^{-4}$ | $8 \times 10^{-4}$ | $1 \times 10^{-3}$ |

As can be understood from Table II, as the thickness t of the second layer 16 is increased, the quantum efficiency is improved. The reason for this is that the number of electrons excited by the circularly polarized laser beam is increased with the thickness t of the second layer 16. In addition, it is known that, as the thickness t of the second layer 16 is increased, the spin polarization is lowered. One of the reasons for this is that, with the increase of the thickness t, the lattice strain of the second layer crystal 16 is lowered or relaxed, that is, the residual strain of the crystal lattice is reduced, and therefore that the energy splitting between the heavy and light hole bands in the valence band of the second layer 16 is decreased. Another reason is that, with a greater thickness t, a higher ratio of the electrons excited in the second layer crystal 16 are scattered inside the crystal 16 before being emitted off the exposed surface of the crystal 16 and the spin direction of the excited electrons can be reversed due to the scattering. However, this polarization reduction is small, and provides no problem for practical use of the device 10. On the other hand, since the quantum efficiency is increased, the overall performance or quality of the spin-polarized electron beam emitting device 10 is improved.

While, in each of Examples 1 to 3, the semiconductor device 10 is formed such that the energy splitting between the heavy and light hole bands is greater than the energy of thermal noise at room temperature, it is required in accordance with the present invention that the energy splitting be greater than the thermal noise energy at the time of use of the device 10.

Although, in each of Examples 1 to 3, the lattice constant of the second layer 16 is greater than that of the first layer 14, it is possible to form the device 10 such that the lattice constant of the second layer 16 is smaller than that of the first layer 14. In the latter case, the energy level of the light hole band is higher than that of the heavy hole band.

EXAMPLE 4

Figure 11:
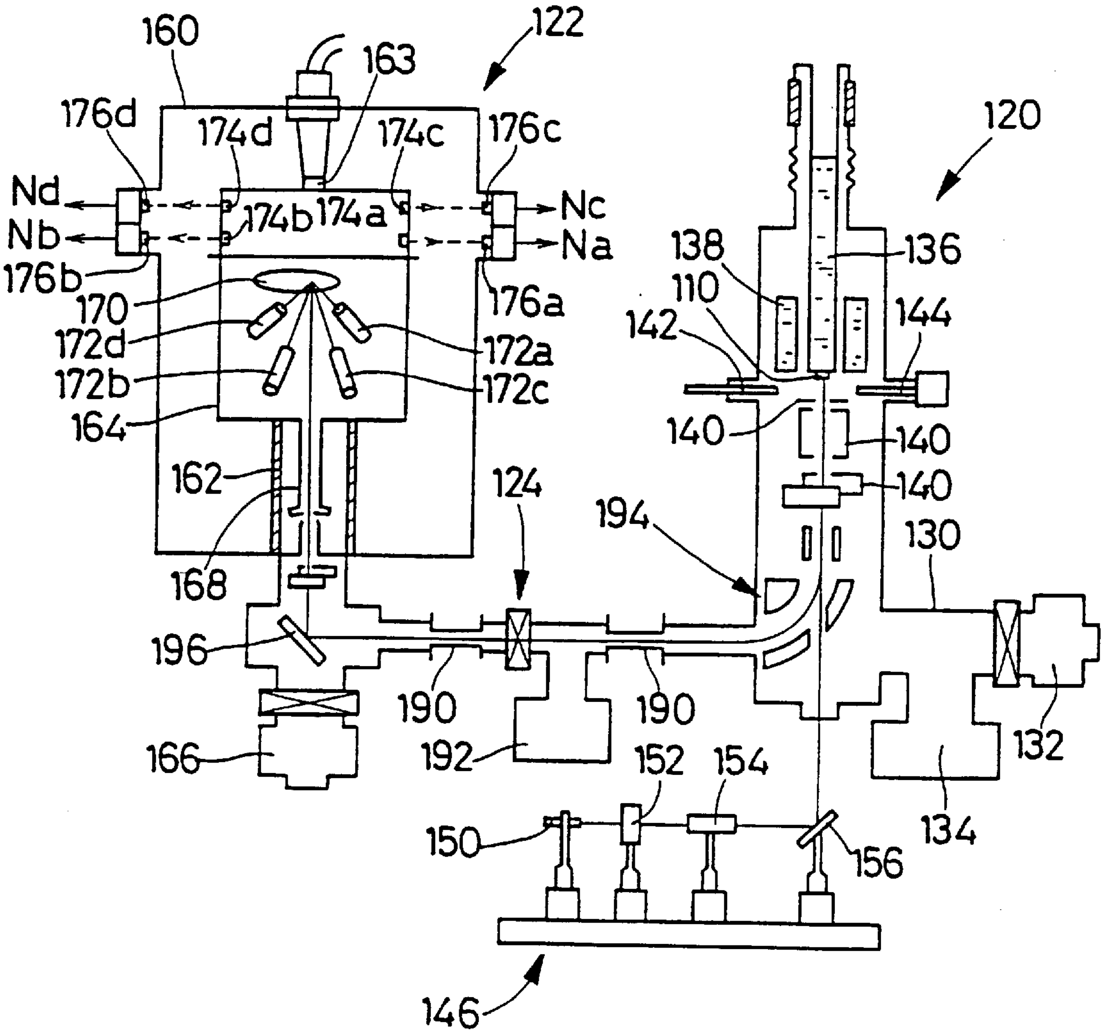
FIG. 11 is a diagrammatic view of a surface magnetism observing apparatus employing the semiconductor device of FIG. 1.

FIG. 11 shows an apparatus for observing the magnetic domain structures on the surface of a magnetic substance or body 196. The apparatus incorporates a semiconductor device 10 of FIG. 1 (i.e., element designated at numeral 110 in FIG. 11). Specifically, the apparatus includes an electron beam generator (electron gun) 120 for emitting a highly spin-polarized electron beam in which a large or major portion of the electrons have their spins aligned in one of the two spin directions. The electron gun 120 includes, as the device 110, a semiconductor device according to the above-indicated Example 1, for example. The apparatus of FIG. 11 further includes a transmission assembly 124 for transmitting the electron beam emitted from the electron gun 120 or device 110 and applying the electron beam to the surface of the magnetic body 196, and a spin analyzer 122 for detecting the spin directions of the electrons reflected, or emitted, from the surface of the magnetic body 196.

The electron gun 120 of FIG. 11 has the same configuration as that of the electron gun 20 of FIG. 4, though the individual elements shown in FIG. 11 are allotted numerals greater by 100 than their corresponding elements shown in FIG. 4. Therefore, the description of those elements are skipped.

The transmission assembly 124 of FIG. 11 has a similar configuration as that of the transmission assembly 24 of FIG. 4, though the individual elements are designated at numerals greater by 100 than their corresponding elements shown in FIG. 4. Thus, the description of those elements are skipped. However, in the present assembly 124, the magnetic body 196 is positioned in place of the Helmholtz coil 96 of FIG. 4. In addition, the present assembly 124 includes a scanning device for moving the magnetic body 196 so that the electron beam scans the surface of the body 196.

The spin analyzer 122 includes a high-voltage tank (Mott's scattering tank) 164 which is disposed in a gas tank 160 filled with Freon and is supported by a high-voltage insulator 162 and to which a 100 kV electric voltage is applied through an anode 163. The analyzer 122 further includes a turbo-molecular pump 166 for sucking gas from the high-voltage tank 164 and thereby placing the tank 164 under a high vacuum of about $10^{-9}$ torr, an accelerator electrode 168 for accelerating the electrons reflected or emitted from the magnetic body 196, a gold (Au) foil 170 which is supported by a disk (not shown) and to which the electrons are incident, four surface barrier detectors 172 (172*a*, 172*b*, 172*c*, 172*d*) for detecting the electrons scattered in the direction of θ=120° due to collision of the electrons with atomic nuclei of the Au foil 170, four light emitting diodes (LED) 174 (174*a*, 174*b*, 174*c*, 174*d*) each for converting, to a light, an electric signal generated by a corresponding one of the surface barrier detectors 172 and amplified by a pre-amplifier (not shown), and four light detectors 176 (176*a*, 176*b*, 176*c*, 176*d*) each for receiving the light emitted by a corresponding one of the LEDs 174 and converting the light into an electric signal N (Na, Nb, Nc, Nd).

Figure 12:
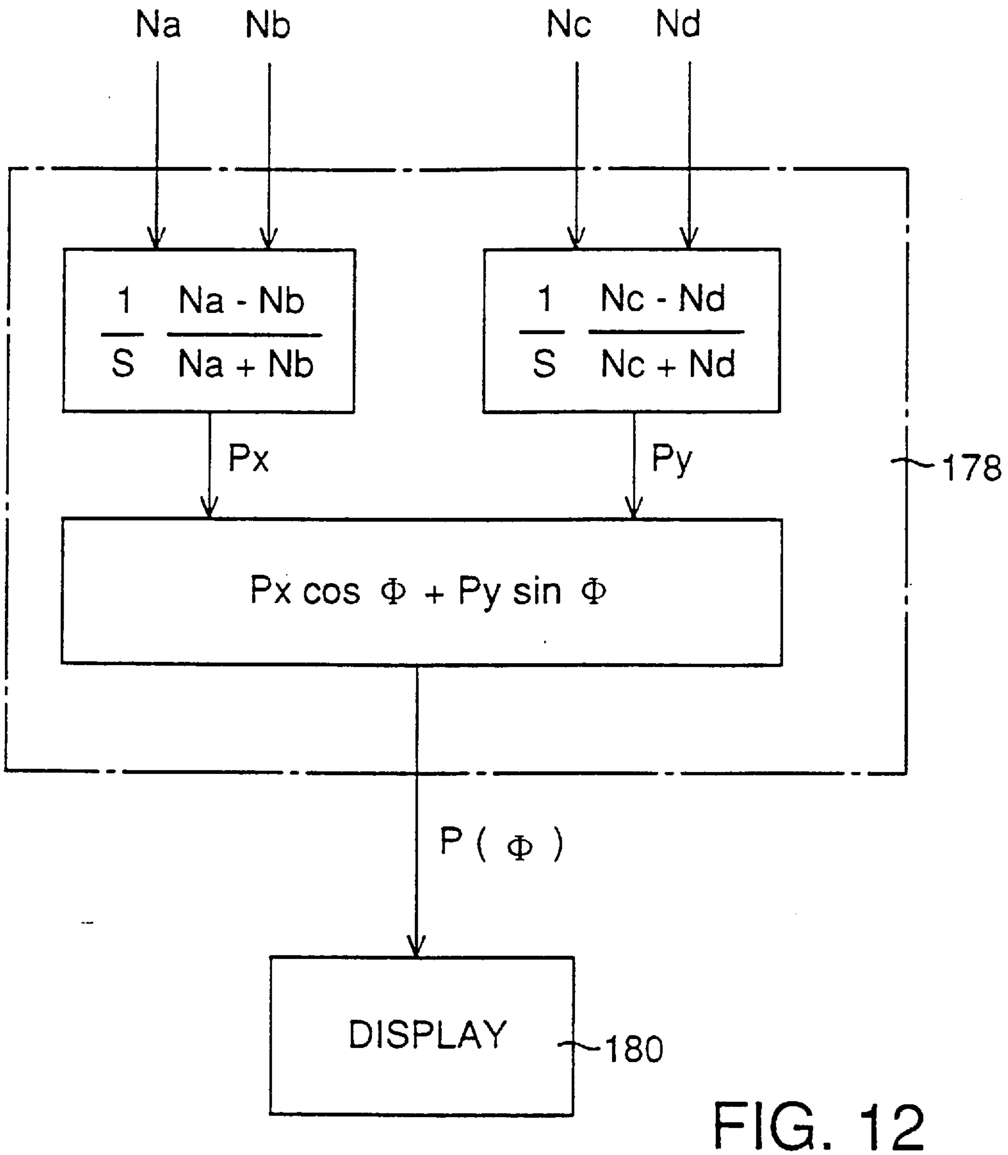
FIG. 12 is a diagrammatic view of an electric circuit of the apparatus of FIG. 11 which processes electric signals.

FIG. 12 shows an electric circuit 178 for processing the electric signals Na, Nb, Nc, Nd, determining the two components, $P_x$ and $P_y$, of a spin polarization vector based on the asymmetry of the scattering magnitudes Na, Nb,NNc, Nd in the symmetric directions, and calculating the polarization vector P (Φ) based on the two components $P_x$, $P_y$. The apparatus of FIG. 11 further includes a display 180 such as a cathode ray tube (CRT) for indicating the image of the magnetism of the surface of the magnetic body 96, based on the polarization vector P (Φ). The symbol "Φ" is indicative of the angle of spin with respect to a stationary coordinate system of the apparatus of FIG. 11. The coordinate system is provided in a plane perpendicular to the direction of flow of the electrons from the magnetic body 196 toward the Au foil 170, that is, plane of the Au foil 170. The angle Φ is defined as being 0° at the intersection between the plane of Au foil 170 and a plane containing the surface barrier detectors 172*a*, 172*b*. In addition, the symbol "S" shown in FIG. 12 is a parameter indicative of the degree of asymmetry due to the spin-orbit interaction, that is, parameter indicative of the difference in probability of the scattering in ±120° directions depending upon the spin directions.

As described previously, the spin polarization of an electron beam emitted from the electron gun 120 or semiconductor device 110 (Example 1), is about 86% at the excitation laser wavelengths of 855 to 870 nm. If this spin-polarized electron beam is applied to the surface of the magnetic body 196 by the transmission assembly 124, electrons are reflected or emitted from the surface of the magnetic body 196. The reflected or emitted electrons are accelerated by accelerator electrodes 168 so as to be incident to the Au foil 170 located in the high-voltage tank 164. The electrons are scattered by the Au foil 170 in an asymmetrical manner depending upon the spin directions thereof, and are detected by the surface barrier detectors 172 (172*a* to 172*d*). Since the transmission assembly 124 displaces the magnetic body 196 so that the electron beam scans the surface of the body 196, the display 180 displays the images of the magnetic domain structures in the surface of the magnetic body 196. Before the observation, the surface of the magnetic body 196 is cleaned by a surface cleaning device (not shown) such as an ion gun.

In the present observation apparatus, a highly spin-polarized electron beam emitted from the semiconductor device 110 is utilized for scanning the surface of the magnetic body 196. Even if the highly spin-polarized electron beam is used at a low current value (i.e., probe current), image signals with a high signal to noise (S/N) ratio are obtained in a short time.

Since the semiconductor device 110 is capable of emitting a highly spin-polarized electron beam in a stable manner, the high S/N image signals are obtained in a stable manner. In addition, the present apparatus is free from the problem that the accuracy of detection of the spin directions of the electrons is lowered because of the fluctuation in spin polarization of a spin-polarized electron beam.

In place of the semiconductor device 110 according to Example 1, it is possible to employ other sorts of spin-polarized electron beam emitting devices.

The present apparatus is capable of observing not only the locations of magnetic domain walls, the areas of magnetic domains and the directions of magnetization of magnetic domains, but also atomic arrangements and the microscopic magnetic features of a magnetic body in the order of atomic dimensions.

While the spin analyzer 122 of the present apparatus is of the Mott type which detects the spin directions of electrons based on Mott scattering, it is possible to use other sorts of spin analyzers such as of the Muller type which operates based on Muller scattering.

Since a spin-polarized electron beam is utilized in the present apparatus, the apparatus is not necessarily required to detect the spin directions of the electrons. More specifically, the spin directions of a spin-polarized electron beam emitted from the electron gun 122 or semiconductor device 110 can be reversed by changing the directions of polarization of the circularly polarized laser beams each of which is injected into the device 110. In the case where the present apparatus includes an electron beam generator which can selectively emit two kinds of spin-polarized electron beams whose spin directions are opposite to each other, the apparatus can detect the magnetism of the surface of the magnetic body 196 by using a common electron beam analyzer, without having to use the spin analyzer 122.

The primary electrons, i.e., spin-polarized electron beam applied to the surface of the magnetic body 196, is diffracted under the diffraction condition defined by the crystal structure of the magnetic body 196. Thus, the diffraction pattern or image of the magnetic body 196 is influenced by the magnetism of each portion of the surface to which the electron beam is applied. While the diffraction image is obtained based on the magnitudes of the diffracted electron beams, the magnetism of the surface of the magnetic body 196 is measured by obtaining the diffraction image. In order to obtain the diffraction image, an electron beam analyzer may be disposed at a location which can be specified in advance based on, for example, the crystal structure of the magnetic body 196. In this case, the intensities of electron beams detected by the analyzer at that location may suffice for providing a diffraction image. In the present case, too, an electron beam source which selectively emits two kinds of spin-polarized electrons whose spin directions are opposite to each other, is advantageously used for detecting the magnetism of the surface of the magnetic body 196 by using the electron beam analyzer. The present apparatus is capable of observing the magnetism of an antiferromagnetic body, based on a diffraction image thereof, though the magnetism of such a body cannot be observed by using a common, non-polarized electron beam.

Figure 13:
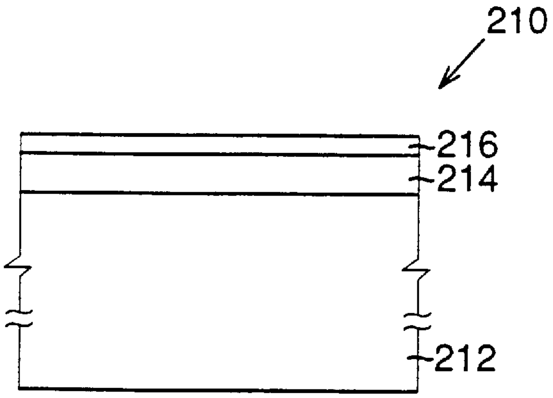
FIG. 13 is a view of another spin-polarized electron beam emitting device as a second embodiment of the present invention.

Referring next to FIG. 13, there is shown another spin-polarized electron beam emitting device 210 as a second embodiment in accordance with the present invention. The device 210 includes a gallium arsenide (GaAs) semiconductor crystal substrate 212. On the GaAs substrate 212, a first crystal of gallium arsenide phosphide ($GaAs_{1-x}P_x$), and subsequently a second crystal of gallium arsenide phosphide ($GaAs_{1-y}P_y$), are grown by the MOCVD method to provide a first and a second compound semiconductor layer 214, 216, respectively. The GaAs substrate 212 has a thickness of about 350 $\mu$m. Impurities such as zinc (Zn) are doped into the GaAs substrate 212, so as to provide a p-type GaAs semiconductor monocrystalline substrate (p-GaAs) having a carrier concentration of about $5\times10^{18}$ ($cm^{-3}$). The GaAs substrate 212 has a (100) plane face. The first $GaAs_{1-x}P_x$ layer 214 grown on the GaAs substrate 212 has a considerably great thickness of about 2.0 $\mu$m. Impurities such as zinc are doped into the first $GaAs_{1-x}P_x$ layer 14, so as to provide a p-type $GaAs_{1-x}P_x$ semiconductor monocrystalline layer (p-$GaAs_{1-x}P_x$) having a carrier concentration of about $5\times10^{18}$ ($cm^{-3}$). The second $GaAs_{1-y}P_y$ layer 216 has a predetermined thickness, t. Impurities such as zinc are doped into the second $GaAs_{1-y}P_y$ layer 216, so as to provide a p-type $GaAs_{1-y}P_y$ semiconductor monocrystalline layer (p-$GaAs_{1-y}P_y$) having a carrier concentration of about $5\times10^{18}$ ($cm^{-3}$). The second $GaAs_{1-y}P_y$ layer 216 has no oxidation treatment film or the like on the exposed surface thereof.

A fraction, x, of the first $GaAs_{1-x}P_x$ layer 214 falls in the range of $0\leqq x<1$, and similarly a fraction, y, of the second $GaAs_{1-y}P_y$ layer 216 falls in the range of $0\leqq y<1$. However, in the present embodiment, the fraction x is selected at a value greater than the fraction y (i.e., x>y), in order to produce a residual strain, $\epsilon_R$, in the second $GaAs_{1-y}P_y$ layer 216 and produce a smaller energy gap between an energy level of a higher one of a heavy hole band and a light hole band of a valence band, and an energy level of a conduction band, of the second $GaAs_{1-y}P_y$ layer 216, than that of the first $GaAs_{1-x}P_x$ layer 214. An absolute value of fraction difference, $|x-y|$, of the fractions x, y of the first and second layers 214, 216 (hereinafter, referred to simply as the "fraction difference"), and a thickness, t, of the second $GaAs_{1-y}P_y$ layer 216 are determined so as to provide a residual strain, $\epsilon_R$, of not less than $2.0\times10^{-3}$ in the second layer 216. More specifically, the fraction difference $|x-y|$ and the thickness t in angstrom unit take respective values which satisfy the following approximate expression (5) or (6):

$$t\leqq-18000\cdot|x-y|+8400 \quad (5)$$

$$t\leqq-7000\cdot|x-y|+5100 \quad (6)$$

The present, second device 210 is different from the above-described, first device 10 only in that the second $GaAs_{1-y}P_y$ layer 216 of the second device 210 is employed in place of the second GaAs layer 16 of the first device 10. In the case where the fraction y of the $GaAs_{1-y}P_y$ layer 216 is zero (i.e., y=0), the $GaAs_{1-y}P_y$ layer 216 is identical with the GaAs layer 16. Therefore, all the description provided for the first device 210 applies to the second device 210, except that the fraction difference |x−y| is employed, for the second device 210, as a parameter corresponding to the fraction x for the first device 10. For example, for the second device 210, the variable, f, in the above-indicated, critical-thickness ($t_c$) defining expression (3) is defined by the fraction difference |x−y| of the first and second layers 214, 216. Thus, the second device 210 possesses the relationship between the thickness ratio $t/t_c$ and the residual strain ratio R ($=\epsilon_R/\epsilon_c$) as shown in FIG. 2, and the relationship between the energy splitting ΔE and the spin polarization P as shown in FIG. 3. The spin polarization P of the electron beam emitted from the second device 210 may be measured by the apparatus shown in FIGS. 4 and 5, in the same manner as described for the first device 10.

Figure 14:
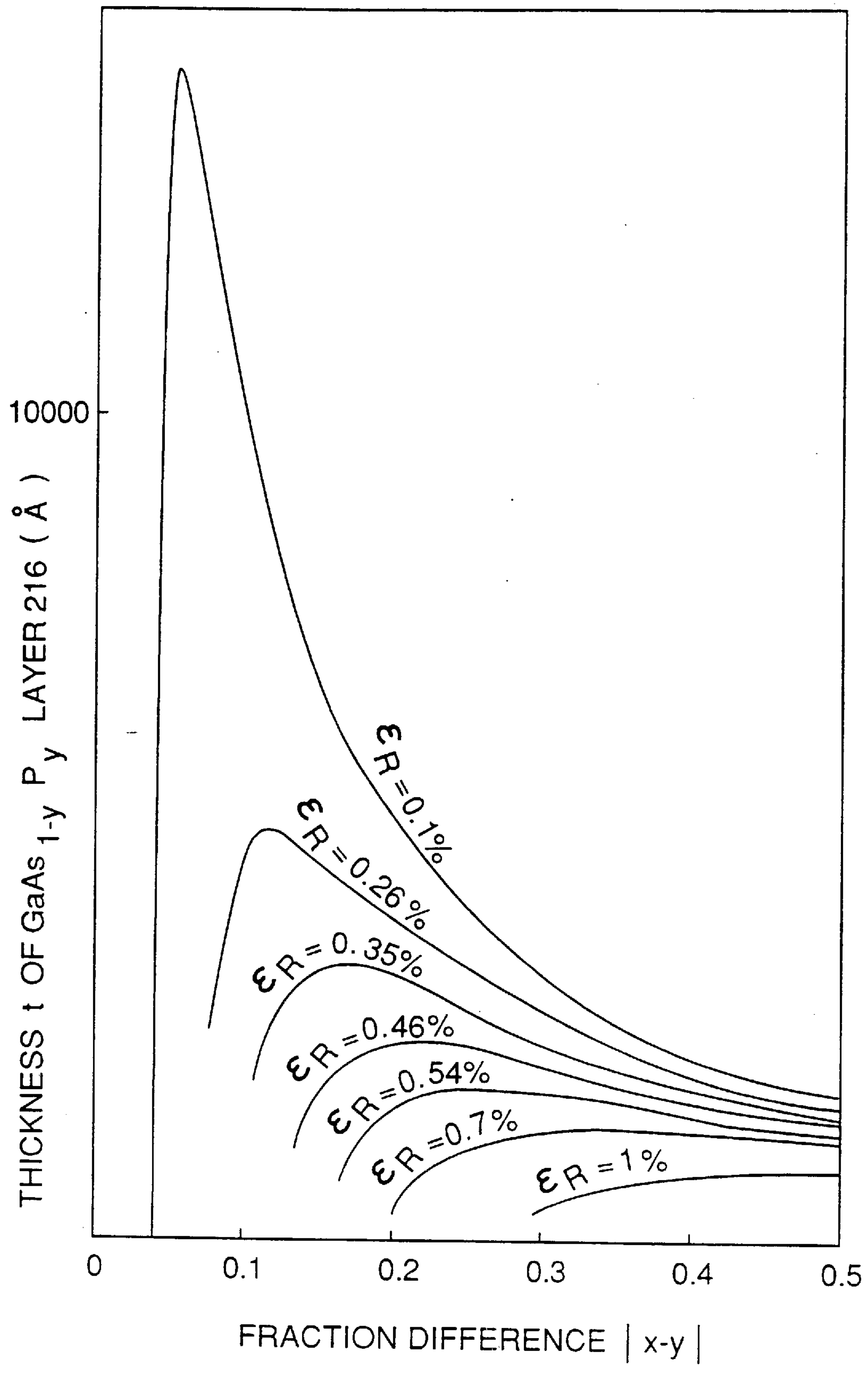
FIG. 14 is a graph representing the relationship between a fraction difference, |x−y|, of a first and a second gallium arsenide phosphides, $GaAs_{1-x}P_x$ and $GaAs_{1-y}P_y$, as two semiconductor layers of the device of FIG. 13, and a thickness t of the $GaAs_{1-y}P_y$ second layer of the device, as a residual strain, $\epsilon_R$, in the second layer is varied as a parameter.

The coherent strain $\epsilon_c$ of the second $GaAs_{1-y}P_y$ layer 216 is known in the art. Therefore, if the actual thickness t of the second layer 216 and the fraction difference |x−y| of the first $GaAs_{1-x}P_x$ layer 214 are given, a residual strain $\epsilon_R$ of the second layer 216 can be determined according to the relationship shown in FIG. 2. FIG. 14 shows relationships between these three variables, |x−y|, t, and $\epsilon_R$. More specifically, various curves shown in the graph of FIG. 14 represent corresponding relationships between the fraction difference |x−y| and the thickness t, as the residual strain $\epsilon_R$ varies as a parameter. Since the energy splitting ΔE due to the degeneracy in the valence band of the second layer 216 is defined by the residual strain $\epsilon_R$ according to the above-indicated expression (4), the relationship between the spin polarization P of the electron beam and the residual strain $\epsilon_R$, and the relationship between the polarization P and the fraction difference |x−y| or thickness t, are determined based on the curve shown in FIG. 3. Table III indicates respective values of the energy splitting ΔE, residual strain $\epsilon_R$, fraction difference |x−y|, and thickness t, when the spin polarization P takes 50%, 60%, 70%, 80% or 85%.

It emerges from the foregoing description that, in order to obtain, for example, a not less than 50% spin polarization of an electron beam emitted from the semiconductor device 210, the fraction difference |x−y| and the thickness t are selected at respective values each positioned on or under a curve (not shown in FIG. 14) representing a relationship between the variables |x−y|, t in the case where the residual strain $\epsilon_R$ is 0.2%.

TABLE III

| P | ΔE (meV) | $\epsilon_R$ | Conditional Expression of \|x − y\| and t (t in angstrom unit) |
|---|---|---|---|
| ≧50% | ≧13 | ≧2.0 × $10^{-3}$ | t ≦ −18000 · \|x − y\| + 8400 or t ≦ −7000 · \|x − y\| + 5100 |
| ≧60% | ≧17 | ≧2.6 × $10^{-3}$ | t ≦ −12000 · \|x − y\| + 6400 or t ≦ −6000 · \|x − y\| + 4600 |
| ≧70% | ≧23 | ≧3.5 × $10^{-3}$ | t ≦ −10000 · \|x − y\| + 5600 or t ≦ −6000 · \|x − y\| + 4400 |
| ≧80% | ≧30 | >4.6 × $10^{-3}$ | t ≦ −4000 · \|x − y\| + 3400 |
| ≧85% | ≧35 | ≧5.4 × $10^{-3}$ | t ≦ −3000 · \|x − y\| + 2800 and t ≦ 22000 · \|x − y\| − 2200 |

In order to obtain a not less than 60% spin polarization, the fraction difference |x−y| and the thickness t are selected at respective values each on or under the curve, shown in FIG. 14, representing the relationship between the variables |x−y|, t in the case where the residual strain $\epsilon_R$ is 0.26%. In order to obtain a not less than 70% spin polarization, the fraction difference |x−y| and the thickness t are selected at respective values each on or under the curve of the |x−y|−t relationship in the case where the residual strain $\epsilon_R$ is 0.35%. In order to obtain a not less than 80% spin polarization, the fraction |x−y| and the thickness t are selected at respective values each on or under the curve of the |x−y|−t relationship in the case where the residual strain $\epsilon_R$ is 0.46%. In order to obtain a not less than 85% spin polarization, the fraction difference |x−y| and the thickness t are selected at respective values each on or under the curve of the |x−y|−t relationship in the case where the residual strain $\epsilon_R$ is 0.54%.

The conditional expressions for the fraction difference |x−y| and the thickness t, indicated in the TABLE III, represent respective areas each of which approximates a corresponding one of the actual areas defined by (i.e., located on or under) the respective curves shown in FIG. 14. For example, concerning the conditional expression, t≦−12000·|x−y|+6400 or t≦−6000·|x−y|+4600, for obtaining a not less than 60% spin polarization, the equations, t=−12000·|x−y|+6400 and t=−6000·|x−y|+4600, represent two straight lines which cooperate with each other to approximate the curve representative of the |x−y|−t relationship, shown in FIG. 14, for the case where the residual strain $\epsilon_R$ is 0.26%. Therefore, in this case, for practical purposes, the fraction difference |x−y| and the thickness t are selected at respective values each on or under the straight line defined by either one of the two equations.

Thus, in the semiconductor device 210 as the second embodiment, the fraction difference |x−y| of the gallium arsenide phosphide crystals $GaAs_{1-x}P_x$, $GaAs_{1-y}P_y$ of the first and second semiconductor layers 214, 216 is so selected as to define a difference, i.e., magnitude of mismatch, between the lattice constants of the two semiconductor crystals, such that the magnitude of mismatch and the thickness t of the second semiconductor layer 216 provide a residual strain $\epsilon_R$ of not less than $2.0\times10^{-3}$ in the second semiconductor layer 216. As described above, for practical purposes, the fraction difference |x−y| and the thickness t are determined to satisfy the above-indicated approximation (5) or (6). Therefore, the energy splitting ΔE due to the degeneracy in the valence band of the second layer 216 is required to be not less than 13 meV, so that an electron beam emitted from the device 210 has a not less than 50% spin polarization.

Figure 15:
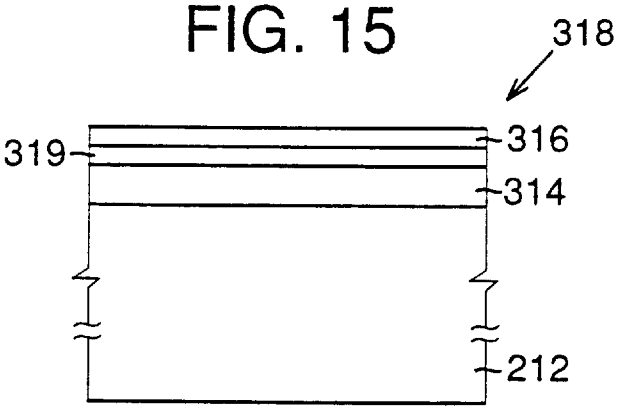
FIG. 15 is a view of yet another spin-polarized electron beam emitting device as a third embodiment of the present invention.

Referring next to FIG. 15, there is shown yet another spin-polarized electron beam emitting device 318 as a third embodiment in accordance with the present invention. The device 318 includes a third compound semiconductor layer 319 provided between a first and a second semiconductor layer 314, 316. The first and second layers 314, 316 are formed of a first crystal of gallium arsenide phosphide ($GaAs_{1-x}P_x$), and a second crystal of gallium arsenide phosphide ($GaAs_{1-y}P_y$) respectively, in the same manner as previously described for the two layers 214, 216 of the second device 210.

However, in the third embodiment, in order to produce a residual strain $\epsilon_R$ in the second $GaAs_{1-y}P_y$ layer 316, the fraction x of the gallium arsenide phosphide $GaAs_{1-x}P_x$ of the first layer 314 is selected at a value smaller than the fraction y of the gallium arsenide phosphide $GaAs_{1-y}P_y$ of the second layer 316 (i.e., x<y). This is converse to the second device 210 wherein x>y. As a result, the second layer 316 has a greater energy gap between an energy level of a higher one of a heavy hole band and a light hole band of a valence band thereof, and an energy level of a conduction band thereof, than that of the first layer 314. Because of the difference between the energy gaps of the first and second layers 314, 316, electrons tend to flow from the second layer 316 to the first layer 314.

For preventing the flow of electrons, the third layer 319 has a greater energy gap than that of the second layer 314. Thus, the third layer 319 contributes to maintaining the efficiency of the third device 318 to produce the spin-polarized electron beam. The third layer 319 is grown with, e.g., aluminum gallium arsenide (AlGaAs) by the MOCVD method, on the first layer 314. The third layer 319 has a thickness of about 0.1 μm, and impurities such as zinc (Zn) are doped into the third layer 319 so as to provide a p-type AlGaAs semiconductor monocrystalline layer (p-AlGaAs) having a carrier concentration of about $5\times10^{18}$ ($cm^{-3}$). The third layer 319 may be formed of a different semiconductor crystal such as Indium gallium phosphide (InGaP) and indium aluminum phosphide (InAlP).

The third device 318 enjoys the same advantages as those of the second device 210 in the case where the fraction difference |x−y| of the first and second layers 314, 316 and the thickness t of the second layer 316 take respective values which satisfy the conditional expressions shown in TABLE III.

In each of the second and third devices 210, 318, the substrate 212 may be formed of a material other than the GaAs crystal. Additionally, in the case where the fraction x of the $GaAs_{1-x}P_x$ crystal of the first layer 214, 314 is zero, the first GaAs layer 214, 314 may be used as the substrate 212. It is possible to interpose an additional semiconductor layer between the substrate 212 and the first layer 214, 314.

While, in the second and third devices 210, 318, the fraction difference |x−y| of the first and second layers (214, 216), (314, 316) and the thickness t of the second layer 216, 316 are determined so as to produce a residual strain $\epsilon_R$ of not smaller than $2.0\times10^{-3}$, it is possible to determine those parameters |x−y|, t according to the conditional expressions shown in TABLE III so as to produce a residual strain $\epsilon_R$ of not smaller than $2.6\times10^{-3}$, preferably not smaller than $3.5\times10^{-3}$, more preferably not smaller than $4.6\times10^{-3}$ and most preferably not smaller than $5.4\times10^{-3}$.

In the third device 318, the fraction x of the gallium arsenide phosphide $GaAs_{1-x}P_x$ of the first layer 314 may be selected at a value greater than the fraction y of the gallium arsenide phosphide $GaAs_{1-y}P_y$ of the second layer 316 (i.e., x>y), and even in this case the third device 318 operates with advantages to some extent. Similarly, in the second device 210, the fraction x of the gallium arsenide phosphide $GaAs_{1-x}P_x$ of the first layer 214 may be selected at a value smaller than the fraction y of the gallium arsenide phosphide $GaAs_{1-y}P_y$ of the second layer 216 (i.e., x<y), and even in this case the second device 210 operates with advantages to some extent.

Figure 16:
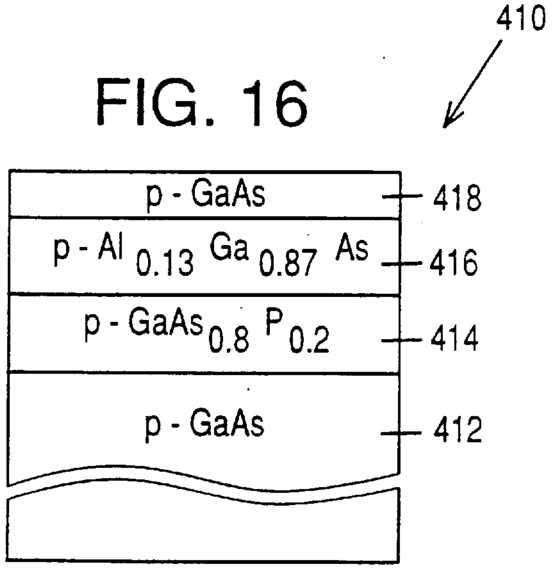
FIG. 16 is a view of a different spin-polarized electron beam emitting device as a fourth embodiment of the present invention.

Referring next to FIG. 16, there is shown another spin-polarized electron beam emitting device 410 as a fourth embodiment in accordance with the present invention. The emitting device 410 includes a gallium arsenide (GaAs) semiconductor crystal substrate 412. On the GaAs substrate 412, a first crystal of gallium arsenide phosphide ($GaAs_{0.8}P_{0.2}$), and subsequently a second crystal of aluminum gallium arsenide ($Al_{0.13}Ga_{0.87}As$), are grown by a known MOCVD apparatus so as to provide a first and a second compound semiconductor layer 414, 416, respectively. A passivation film 418 is grown with gallium arsenide (GaAs) on the second semiconductor layer 416. The GaAs substrate 412 has a thickness of about 350 μm, and impurities such as zinc (Zn) are doped into the GaAs substrate 412 so as to provide a p-type GaAs semiconductor monocrystalline substrate (p-GaAs) having a carrier concentration of about $5\times10^{18}$ ($cm^{-3}$). The GaAs substrate 412 has a (100) plane face. The first layer 414 grown on the GaAs substrate 412 has a thickness of about 2.0 μm (i.e., 2000 nm). Impurities such as zinc are doped into the first layer 14 so as to provide a p-type $GaAs_{0.8}P_{0.2}$ semiconductor monocrystalline layer (p-$GaAs_{0.8}P_{0.2}$) having a carrier concentration of about $5\times10^{18}$ ($cm^{-3}$). The second layer 416 has a thickness of about 200 nm, and impurities such as zinc are doped into the second layer 416 so as to provide a p-type $Al_{0.13}Ga_{0.87}As$ semiconductor monocrystalline layer (p-$Al_{0.13}Ga_{0.87}As$) having a carrier concentration of about $5\times10^{18}$ ($cm^{-3}$). The passivation film 418 has a thickness of about 5 nm, and impurities such as zinc are doped into the GaAs film 418 so as to provide a p-type GaAs semiconductor monocrystalline layer (p-GaAs) having a carrier concentration of about $5\times10^{18}$ ($cm^{-3}$). In FIG. 16, the respective layers 412, 414, 416, 418 of the semiconductor device 410 are not illustrated with their correct thickness proportions to each other.

Figure 17:
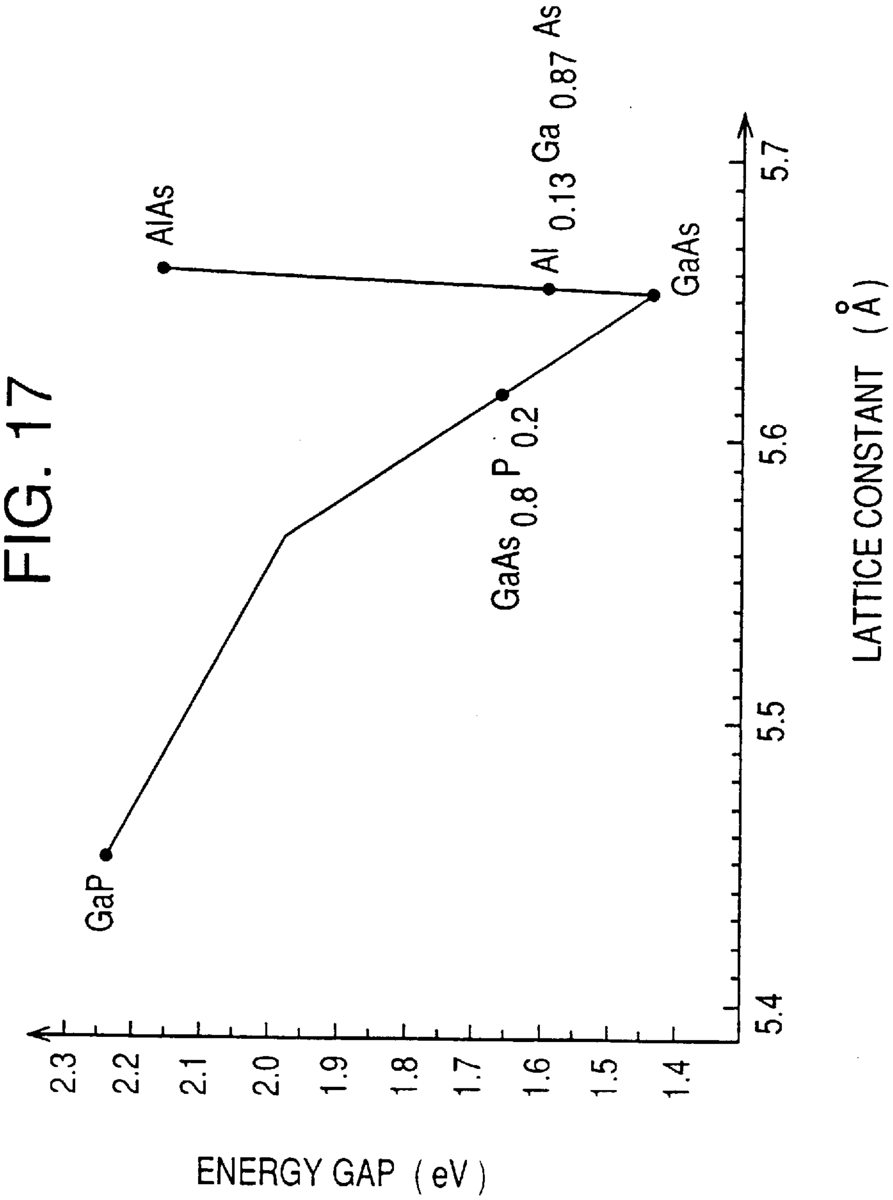
FIG. 17 is a graph representing the lattice constants and energy gaps of various compound semiconductor crystals.

As can be understood from the graph of FIG. 17, the first semiconductor layer 414 has a greater energy gap between the energy level of the higher one of the heavy and light hole subbands of the valence band thereof, and the energy level of the conduction band thereof (hereinafter, referred to simply as the "energy gap"), than the energy gap of the second semiconductor layer 416. Additionally, in the case where a portion of the gallium (Ga) contained in the GaAs crystal is replaced by aluminum (Al), the lattice constant of the thus obtained AlGaAs crystal slightly increases. In the case where a portion of the arsenic (As) contained in the GaAs crystal is replaced by phosphorus (P), the lattice constant of the thus obtained GaAsP crystal decreases. Thus, the lattice constant of the second layer 416 is greater than that of the first layer 414, so that the second layer 416 has a lattice strain. That is, the first and second layers 414, 416 provide a strained semiconductor heterostructure. More specifically, the second layer 416 is subject to tensile stresses in the direction of thickness thereof, i.e., direction in which a spin-polarized electron beam is extracted therefrom. The second layer 416 has a lattice strain due to the tensile stresses, so that an energy difference or splitting is produced between the energy levels of the heavy hole and light hole subbands of the valence band of the second layer 416. Since the spin direction of electrons extracted by exciting one of the two subbands is opposite to that of the other subband, a group of electrons aligned in one of the two spin directions are excited and emitted from one of the two subbands which has the upper energy level than the other subband, when a light energy which excites only the upper-level subband is incident to the second layer 416.

Thus, the second layer 416 of the semiconductor device 410 serves as an photoelectric layer which emits a group of electrons aligned in one of the two spin directions upon reception of an excitation laser beam incident thereon. The energy gap of the second layer 416 is pre-determined at a value substantially equal to the light energy of excitation laser beam used. The energy gap, $E_{g2}$, of the $Al_xGa_{1-x}As$ crystal (x>0) of the second layer 416 is obtained by the following expression (7):

$$E_{g2}=1.42+1.247x \text{ (eV)} \tag{7}$$

Since in the present embodiment an excitation laser beam having a wavelength of 780 nm (corresponding to an energy of 1.5897 eV) is used, the proportion x of the $Al_xGa_{1-x}As$ crystal of the second layer 416 is pre-selected at 0.13.

Meanwhile, according to the present invention, it is required that the magnitude of mismatch between the lattice constants of the first and second layers 414, 416 define an energy difference or splitting between the heavy hole and light hole subbands of the valence band of the second layer 416 such that the energy splitting is greater than a thermal noise energy of the second layer 416 when the semiconductor device 410 is being used. To this end, the lattice constant of the first layer 414 is required to be sufficiently smaller than that of the second layer 416 so as to provide a sufficiently great lattice mismatch. Additionally the energy gap, $E_{g1}$, of the first layer 414 is required to be greater than the energy gap $E_{g2}$ of the second layer 416 so as to prevent electrons from being excited from the first layer 414 when the excitation laser beam is incident on the semiconductor device 410.

However, as the magnitude of mismatch between the lattice constants of the first layer 414 and the substrate 12 increases, the semiconductor crystal of the first layer 414 grown on the substrate 412 becomes irregular, so that the semiconductor crystal of the second layer 416 grown on the first layer 414 accordingly becomes irregular. The electrons excited in the second layer 416 upon incidence thereon of the excitation laser beam are likely re-captured in the crystal 416, and the number of electrons whose spin directions are reversed due to their scattering in the crystal 416 increases. The quantum efficiency and spin polarization of the electron beam emitted from the semiconductor device 410 decrease. For these reasons, it is preferred that the lattice constant of the first layer 414 be equal to that of the substrate 412. Meanwhile, the lattice constant of the $Al_{0.13}Ga_{0.87}As$ crystal of the second layer 416 is almost equal to (in fact, slightly greater than) that of the GaAs crystal of the substrate 412. As the proportion of the phosphorus (P) contained in the GaAsP crystal of the first layer 414 increases, the energy gap $E_{g1}$ of the first layer 414 increases and the lattice constant of the first layer 414 decreases, so that the magnitude of mismatch between the lattice constants of the first and second layers 414, 416 increases. Therefore, the proportion of the phosphorus (P) of the GaAsP crystal of the first layer 414 is pre-selected at as small as possible a value which provides a sufficiently great residual strain $\epsilon_R$ in the second layer 416 and simultaneously provides an energy gap $E_{g1}$ of the first layer 414 which is greater than an energy gap $E_{g2}$ of the second layer 416.

The energy gap $E_{g1}$ of the $GaAs_yP_{1-y}$ crystal (y>0) of the first layer 414 is obtained by the following expression (8):

$$E_{g1}=1.424+1.150y+0.176y^2 \text{ (eV)} \quad (8)$$

In the present embodiment, the proportion, y, of the phosphorus (P) of the GaAsP crystal of the first layer 414 is pre-selected at 0.2, so that the energy gap $E_{g1}$ is 1.661 eV greater than the energy gap $E_{g2}$ of the second layer 416. The first layer 414 also serves as a potential barrier which prevents electrons from flowing from the second layer 416 into the substrate 412.

The passivation film 418 is provided on the second layer 416 for preventing the oxidization of the aluminum (Al) contained in the $Al_{0.13}Ga_{0.87}As$ crystal of the second layer 416. The oxidization of the aluminum of the second layer 416 results in producing an insulator film on the exposed surface of the second layer 416, which film blocks the extraction of electrons from the second layer 416. When electrons are excited from the passivation film 418, the spin polarization of those electrons is about 50% because the degree of mismatch between the lattice constants of the GaAs film 418 and the $Al_{0.13}Ga_{0.87}As$ second layer 416 is very small and therefore the GaAs film 418 has substantially no strain. In order to prevent the decrease of spin polarization of the electron beam emitted from the semiconductor device 410 (i.e., second layer 416), it is required that the number of electrons emitted from the passivation film 418 be reduced to as small as possible. To this end, the thickness of the film 418 is pre-selected at as small as possible a value which assures effective prevention of the oxidization of the aluminum. To this end, in the present embodiment, the film 418 is formed with a thickness of about 5 nm as described above.

In the present semiconductor device 410, the second layer 416 having a lattice constant different from that of the first layer 414, is grown on the first layer 414 so as to provide a strained semiconductor heterostructure. That is, the second layer 416 has a lattice strain, and an energy difference or splitting is produced between the energy levels of the heavy hole and light hole subbands of the valence band of the second layer 416. In the present embodiment, the heavy hole subband has a higher energy level than that of the light hole subband. When a light energy, i.e., an excitation laser beam having a wavelength of about 780 nm is applied to the second layer 416 of the device 410, the light energy excites electrons only from the heavy hole subband. Thus, the device 410 emits an electron beam having a high spin polarization of about 80% wherein the electrons are largely aligned in one of the two spin directions.

In the present embodiment, the second layer 416 that emits a highly spin-polarized electron beam upon reception of an excitation laser beam, is formed of the AlGaAs crystal that has a greater energy gap than that of the GaAs crystal. Therefore, the wavelength of light at which the maximum spin polarization is obtained from the AlGaAs crystal, i.e., about 780 nm as described above, is smaller than the wavelength of light at which the maximum spin polarization is obtained from the GaAs crystal, i.e., about 860 nm. Thus, in the present embodiment, a small-size and low-price semiconductor laser device is employable for applying an excitation laser beam to the semiconductor device 410. This largely improves the practical value or utility of the device 410, for example, in the case where the device 410 is employed for carrying out an experiment using a spin-polarized electron beam.

Since the $Al_{0.13}Ga_{0.87}As$ crystal of the second layer 416 has a greater lattice constant than that of the $GaAs_yP_{1-y}$ crystal of the first layer 414, it is possible to provide a sufficiently great lattice mismatch between the first and second layers 414, 416, even though the first layer 414 may be formed of a $GaAs_yP_{1-y}$ crystal having a considerably great lattice constant. Therefore, it is possible to provide a great mismatch between the lattice constants, and a great difference between the energy gaps, of the first and second layers 414, 416, while at the same time providing a small lattice mismatch between the first layer 414 and the substrate 412. Thus, the crystal of the first layer 414 is grown with low irregularity on the crystal of the substrate 412, so that the crystal of the second layer 416 is grown with low irregularity on the crystal of the first layer 414. Since the crystal of the second layer 416 does not suffer from lattice defects, the electrons which are excited from the second layer 416 are effectively prevented from being re-captured, or being reversed with respect to the spin directions because of being scattered in the crystal 416. For these reasons, the electron beam emitted from the semiconductor device 410 enjoys high quantum efficiency and high spin polarization. The present device 410 is free from the problems caused by the great lattice mismatch between the first layer 414 and the substrate 412, or other problems caused by, e.g., the excitation of electrons from the light hole subband in the case where the light hole subband has a higher energy level than that of the heavy hole subband.

Additionally, in the present device 410, the second layer 416 is formed of the $Al_{0.13}Ga_{0.87}As$ crystal, and the GaAs passivation film 418 is provided on the $Al_{0.13}Ga_{0.87}As$ second layer 416. The $Al_{0.13}Ga_{0.87}As$ and GaAs crystals 416, 418 are advantageous for emitting an electron beam having a high quantum efficiency.

Since the zinc (Zn) is doped into the passivation film 418 such that the crystal 418 has a high carrier concentration of about $5\times10^{18}$ ($cm^{-3}$), the exposed surface of the film 418 is easily made negative with respect to electron affinity (i.e., NEA), so that an electron beam may be extracted from the exposed surface of the film 418.

Figure 18:
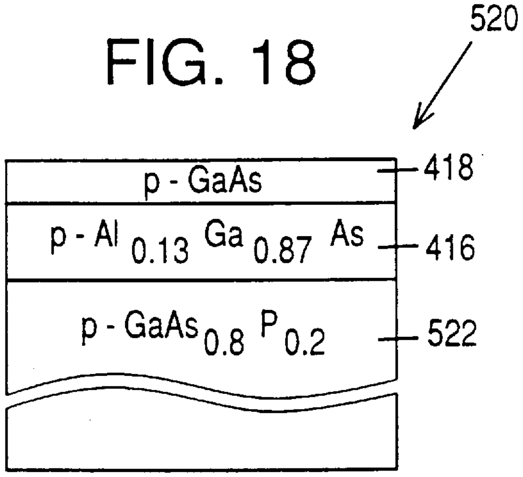
FIG. 18 is a view of a different spin-polarized electron beam emitting device as a fifth embodiment of the present invention.

Referring further to FIG. 18, there is shown a fifth embodiment 520 of the present invention which is different from the semiconductor device 410 of FIG. 16 in that the spin-polarized electron beam emitting device 520 includes a substrate 522 formed of the same p-$GaAs_{0.8}P_{0.2}$ crystal as that of the first layer 414 of the device 410 of FIG. 16. In the fifth embodiment, a second semiconductor layer 416 is directly grown on the substrate 522, with the same p-$Al_{0.13}Ga_{0.87}As$ crystal as that of the second layer 416 of the device 410. In the fifth embodiment, the substrate 522 serves as a first semiconductor layer on which the second semiconductor layer 416 is provided.

Figure 19:
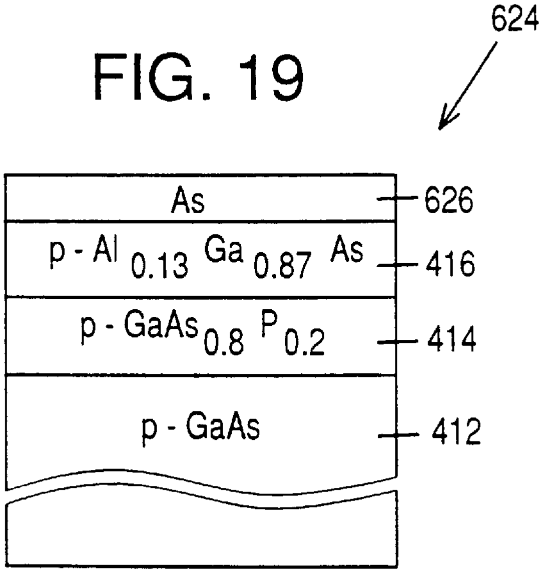
FIG. 19 is a view of a different spin-polarized electron beam emitting device as a sixth embodiment of the present invention.

FIG. 19 shows a sixth embodiment 624 of the present invention which is different from the semiconductor device 410 of FIG. 16 in that the spin-polarized electron beam emitting device 624 includes a passivation film 626 formed of arsenic (As) and having a thickness of about 2 μm, in place of the GaAs film 418 of the device 410 of FIG. 16. The As film 626 serves for preventing, in atmosphere or ambient air, the oxidization of aluminum contained in a second semiconductor layer 416 formed of the same p-$Al_{0.13}Ga_{0.87}As$ crystal as that of the second layer 416 of the device 410. After the chamber in which the semiconductor device 624 is set for its use has been held under a high vacuum, the As film 626 is evaporated by an appropriate manner. Therefore, when the device 624 is actually being used, the second layer 416 functions as the top layer of the multiple-layer device 624.

In each of the fifth and sixth embodiments 520, 624, the $Al_{0.13}Ga_{0.87}As$ crystal is used as the second layer 416. Therefore, like in the fourth embodiment 410, a maximum spin polarization is obtained from the $Al_{0.13}Ga_{0.87}As$ crystal, by using an excitation laser beam having a wavelength smaller than that for the GaAs crystal. Additionally, in the fifth embodiment, the semiconductor device 520 is free from the problem that the quantum efficiency and spin polarization decrease because of the lattice mismatch between the first layer and the substrate.

In each of the fourth to sixth embodiments 410, 520, 624, it is possible to change the proportion of phosphorus (P) contained in the GaAsP crystal of the first layer 414, 522, or change the proportion of aluminum (Al) contained in the AlGaAs crystal of the second layer 416, as needed, so long as the energy gap of the first layer 414, 522 is greater than that of the second layer 416. The first layer 414, 522 may be formed of a semiconductor crystal having a greater lattice constant than that of the crystal $Al_xGa_{1-x}As$ (x>0) of the second layer 416. In the latter case, the valence band of the second layer 416 is split such that the energy level of the light hole subband is higher than that of the heavy hole subband, so that electrons whose spin direction is opposite to that of electrons excited from the heavy hole subband, are excited from the light hole subband.

While in the fourth to sixth embodiments the thickness values of first layer 414, second layer 416, and passivation films 418, 626 are about 2 μm, 200 nm, 5 nm, and 2 μm, respectively, it is possible to change those thickness values, as needed. The carrier concentrations, i.e., amounts of impurities doped into the respective layers 412, 414, 416, 418, 522, and sorts of those impurities may be changed as needed. In the case where there is no possibility of oxidization of the aluminum of the second layer 416, it is not necessary to provide a passivation film on the second layer 416.

Although in the fourth and sixth embodiments the p-GaAs crystal is used as the substrate 412, the substrate 412 may be replaced by a substrate formed of an n-type semiconductor crystal such as n-GaAs or n-$GaAs_{0.8}P_{0.2}$, other compound semiconductor crystals, or silicon (Si) crystal.

While the semiconductor device 410, 520, 624 is adapted such that a maximum spin polarization is obtained by using a light having a wavelength of about 780 nm, it is possible to change the proportion of aluminum contained in the second layer 416, so that a maximum spin polarization is obtained by using a light having a wavelength of about 830 nm. Conversely, it is possible to use a light having a wavelength smaller than 780 nm. Furthermore, in the case where a direct-transition-type semiconductor device is used which ensures that a maximum spin polarization is obtained by using a light having a wavelength of about 630 to 640 nm, a He—Ne laser device may be used in accordance with the present invention.

While the present invention has been described in its preferred embodiments, the invention may otherwise be embodied.

While, in the first to sixth devices 10, 210, 318, 418, 520, 624, the first layer 14, 214, 314, 414, 522 is formed of the gallium arsenide or gallium arsenide phosphide $GaAs_{1-x}P_x$, it is possible to form the first layer by using other sorts of semiconductor materials, such as aluminum gallium arsenide $Al_xGa_{1-x}As$, indium gallium arsenide phosphide $In_{1-x}Ga_xAs_{1-y}P_y$, indium aluminum gallium phosphide $In_{1-x-y}Al_xGa_yP$, or indium gallium phosphide $In_xGa_{1-x}P$.

Although, in the first to sixth devices 10, 210, 318, 418, 520, 624, the second layer 14, 214, 314, 416 is formed of the gallium arsenide or gallium arsenide phosphide $GaAs_{1-x}P_x$ ($0\leqq x<1$) or aluminum gallium arsenide $Al_xGa_{1-x}As$ ($0<x<1$), it is possible to form the second layer by using other sorts of semiconductor materials, such as indium gallium arsenide phosphide $In_{1-x}Ga_xAs_{1-y}P_y$, indium aluminum gallium phosphide $In_{1-x}Al_xGa_yP$, or indium gallium phosphide $In_xGa_{1-x}P$.

It is to be understood that the present invention may be embodied with various changes, modifications and improvements that may occur to those skilled in the art without departing from the scope and spirit of the invention defined by the appended claims.

What is claimed is:

1. A semiconductor device for emitting, upon receiving a light energy, a highly spin-polarized electron beam, comprising:

a first compound semiconductor layer having a first lattice constant;

a second compound semiconductor layer having a second lattice constant different from said first lattice constant, and being in junction contact with said first compound semiconductor layer to provide a strained semiconductor heterostructure, said second compound semiconductor layer emitting said highly spin-polarized electron beam upon receiving said light energy; and a magnitude of mismatch between said first and second lattice constants of said first and second layers defining an energy splitting between a heavy hole band and a light hole band in said second layer, such that said energy splitting is greater than a thermal noise energy in said second layer, wherein said second compound semiconductor layer has a thickness greater than a critical thickness thereof.

2. The semiconductor device as set forth in claim 1, wherein said first compound semiconductor layer is formed of gallium arsenide phosphide (GaAsP) crystal.

3. The semiconductor device as set forth in claim 1, wherein said second compound semiconductor layer is formed of gallium arsenide (GaAs) crystal.

4. The semiconductor device as set forth in claim 1, wherein said first compound semiconductor layer is formed of a semiconductor crystal selected from the group consisting of aluminum gallium arsenide AlGaAs, indium gallium arsenide phosphide InGaAsP, indium aluminum gallium phosphide InAlGaP, and indium gallium phosphide InGaP.

5. The semiconductor device as set forth in claim 1, wherein said second lattice constant of said second compound semiconductor layer is greater than said first lattice constant of said first compound semiconductor layer.

6. The semiconductor device as set forth in claim 1, wherein said second lattice constant of said second compound semiconductor layer is smaller than said first lattice constant of said first compound semiconductor layer.

7. The semiconductor device as set forth in claim 1, further comprising a semiconductor substrate on which said first and second compound semiconductor layers are formed one on another in the order of description.

8. The semiconductor device as set forth in claim 7, wherein said semiconductor substrate is formed of gallium arsenide (GaAs) crystal.

9. The semiconductor device as set forth in claim 1, wherein the thickness of said second compound semiconductor layer is smaller than a thickness of said first compound semiconductor layer.

10. The semiconductor device as set forth in claim 1, wherein the highly spin-polarized electron beam has not less than 50% spin polarization.

11. The semiconductor device as set forth in claim 1, wherein the highly spin-polarized electron beam has not less than 85% spin polarization.

12. A process of producing a highly spin-polarized electron beam, comprising the steps of:

applying a light energy to a semiconductor device comprising a first compound semiconductor layer having a first lattice constant and a second compound semiconductor layer having a second lattice constant different from said first lattice constant, said second semiconductor layer being in junction contact with said first semiconductor layer to provide a strained semiconductor heterostructure, a magnitude of mismatch between said first and second lattice constants of said first and second semiconductor layers defining an energy splitting between a heavy hole band and a light hole band in said second semiconductor layer, such that said energy splitting is greater than a thermal noise energy in said second semiconductor layer in use, wherein said second compound semiconductor layer has a thickness greater than a critical thickness thereof, and extracting said highly spin-polarized electron beam from said second semiconductor layer of said semiconductor device upon receiving said light energy.

13. The process as set forth in claim 12, wherein the thickness of said second compound semiconductor layer is smaller than a thickness of said first compound semiconductor layer.

14. The process as set forth in claim 12, wherein the highly spin-polarized electron beam has no less than 50% spin polarization.

15. The process as set forth in claim 12, wherein the highly spin-polarized electron beam has no less than 85% spin polarization.

16. The process as set forth in claim 12, wherein said energy splitting between said heavy and light hole bands in said second semiconductor layer is greater than said thermal noise energy in said second semiconductor layer at room temperature.

17. The process as set forth in claim 12, wherein said light energy comprises a circularly polarized light having a selected wavelength.

18. The process as set forth in claim 17, wherein said selected wavelength ranges from about 700 nm to about 900 nm.

19. The process as set forth in claim 17, wherein said selected wavelength ranges from about 855 nm to about 870 nm.

20. The process as set forth in claim 12, wherein one of opposite major surfaces of said second semiconductor layer provides a surface exposed to receive said light energy.

21. The process as set forth in claim 20, further comprising a step of treating said exposed major surface of said second semiconductor layer so that said exposed major surface is negative with respect to electron affinity.

22. The process as set forth in claim 12, further comprising a step of placing said semiconductor device in a vacuum housing.

* * * * *